US008970309B2

(12) United States Patent
Sato et al.

(10) Patent No.: US 8,970,309 B2
(45) Date of Patent: Mar. 3, 2015

(54) ATOMIC OSCILLATOR AND METHOD FOR FABRICATING ATOMIC OSCILLATOR

(75) Inventors: Shunichi Sato, Miyagi (JP); Akihiro Itoh, Miyagi (JP); Yukito Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 29 days.

(21) Appl. No.: 13/546,531

(22) Filed: Jul. 11, 2012

(65) Prior Publication Data

US 2013/0015920 A1 Jan. 17, 2013

(30) Foreign Application Priority Data

Jul. 13, 2011 (JP) ................................ 2011-155152
Mar. 23, 2012 (JP) ................................ 2012-066675

(51) Int. Cl.
*H03L 7/26* (2006.01)
*G04F 5/14* (2006.01)

(52) U.S. Cl.
CPC ... *G04F 5/14* (2013.01); *H03L 7/26* (2013.01)
USPC .............................................. 331/3; 331/94.1

(58) Field of Classification Search
CPC ........................................................ H03L 7/26
USPC .................................................... 331/3, 94.1
See application file for complete search history.

(56) References Cited

U.S. PATENT DOCUMENTS 6,806,784 B2 10/2004 Hollberg et al.
2005/0007118 A1 1/2005 Kitching et al.
2007/0034809 A1 2/2007 Lal et al.

FOREIGN PATENT DOCUMENTS

JP 2009-176852 8/2009
JP 2009-212416 9/2009
JP 2009-283526 12/2009

OTHER PUBLICATIONS

European search report dated Sep. 28, 2012 in corresponding European patent application No. 12175758.7.
Y Petremend et al: "Low Temperature Indium-Based Sealing of Microfabricated Alkali Cells for Chip Scale Atomic Clocks" 24 European Frequency and Time Forum Jan. 1, 2010.
European search report dated Jan. 23, 2013 in connection with corresponding European patent application No. 12175758.7
M. Hasegawa et al., Microfabrication of cesium vapor cells with buffer gas for MEMs atomic clocks, Sensors and Actuators A: Physical, 2011, p. 594-601, vol. 167, Elsevier B.V.
L. Liew et al., "Microfabricated alkali atom vapor cells," Applied Physics Letters, Apr. 5, 2004, p. 2694-2696, vol. 84-14, AIP.

(Continued)

*Primary Examiner* — Arnold Kinkead
(74) *Attorney, Agent, or Firm* — Cooper & Dunham LLP

(57) ABSTRACT

An atomic oscillator is disclosed, including an Alkaline metal cell, a light source illuminating a laser beam to the Alkaline metal cell, and a light detector detecting light passing through the Alkaline metal cell. The Alkaline metal cell includes a first member, a second member, a cell internal portion, and an Alkaline metal raw material. In the first member, a first glass substrate is bonded on a second surface of a first substrate where a first opening part is formed. In the second member, a second glass substrate is bonded to a fourth surface of a second substrate where a second opening part is formed. The cell internal portion is formed by the first opening part and the second opening part by bonding the first surface to the third surface. The Alkaline metal raw material is enclosed by the cell internal portion.

17 Claims, 22 Drawing Sheets

102 120 110 111 111 110 101 120 130

411c 402 120 412 410b 410a 401 120 413a 130 413b 440

(56) References Cited

OTHER PUBLICATIONS

S. Knappe et al., "A microfabricated atomic clock," Applied Physics Letters, Aug. 30, 2004, p. 1460-1462, vol. 85-9, AIP.

S. Knappe et al., "Atomic vapor cells for chip-scale atomic clocks with improved long-term frequency stability," Optics Letters, Sep. 15, 2005, p. 2351-2353, vol. 30-18, OSA.

L. Liew et al., "Wafer-level filling of microfabricated atomic vapor cells based on thin-film deposition and photolysis of cesium azide," Applied Physics Letters, Mar. 15, 2007, vol. 90, 114106, AIP.

L. Nieradko et al., "New Approach of fabrication and dispensing of micromachined cesium vapor cells," Journal of Micro/Nanolithography, MEMS, and MOEMS, Aug. 6, 2008, vol. 7-3, Mar. 30, 2013, SPIE.

S. Knappe, "MEMS Atomic Clocks," Comprehensive Microsystems, 2008, p. 571-612, vol. 3.18, Elsevier Ltd.

FIG.4A
110
FIG.4B
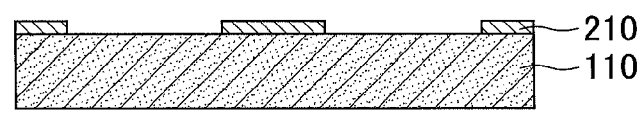
FIG.4C
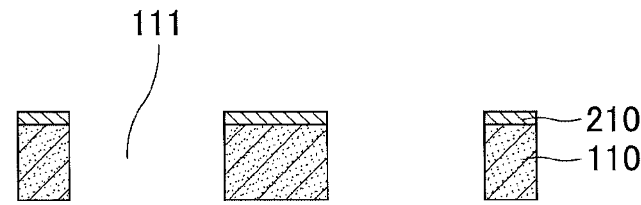
FIG.4D
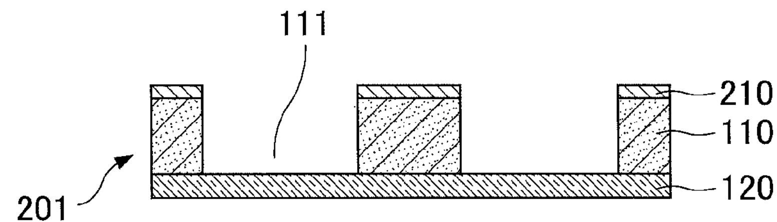

111
110a
110
301
120

111
110a
110
301
120
130

302
120
110
110a
110
301
120
130
313
9A 340
340
120
110
110a
110
120
130
313

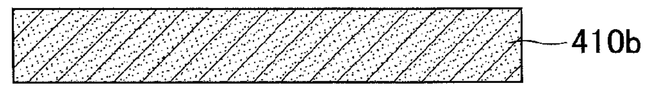
FIG.7A
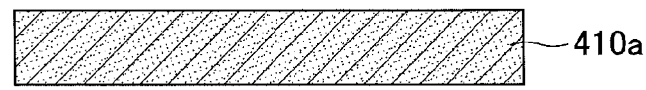
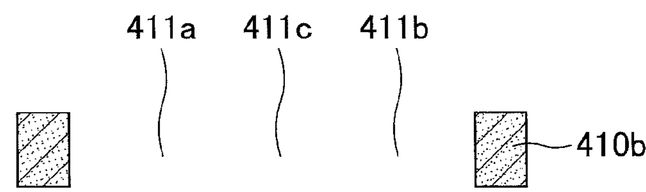
FIG.7B
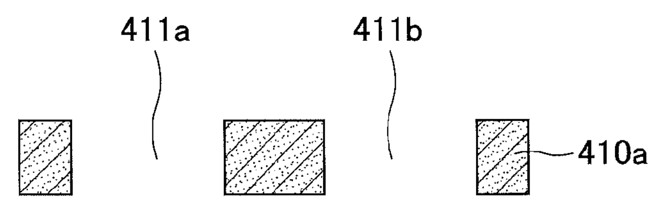
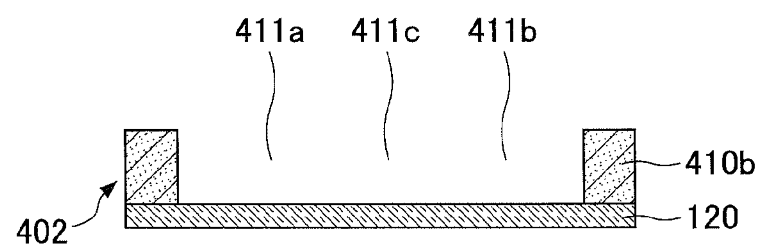
FIG.7C
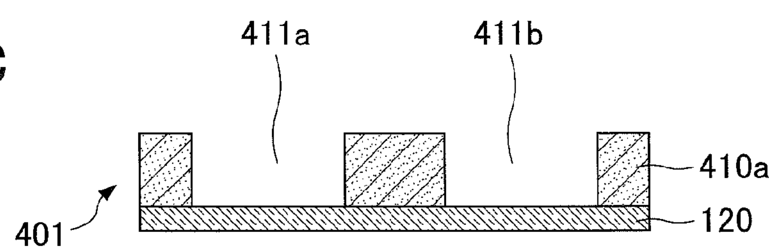

FIG.9A
110
FIG.9B
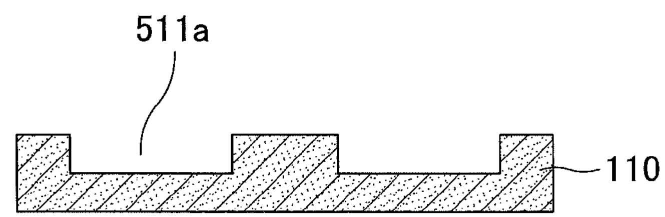
FIG.9C
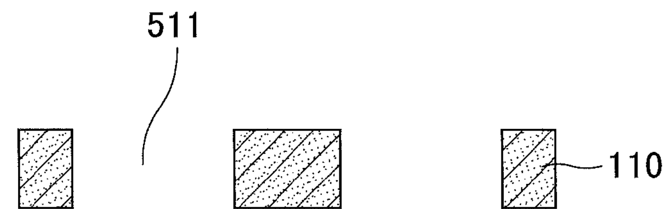
FIG.9D
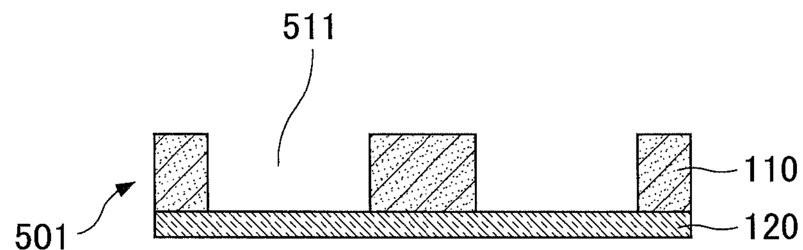

ATOMIC OSCILLATOR AND METHOD FOR FABRICATING ATOMIC OSCILLATOR

BACKGROUND OF THE INVENTION

1. Field of the Invention

The present invention is related to an atomic oscillator and a method for fabricating the atomic oscillator.

2. Description of the Related Art

An atomic clock (atomic oscillator) is regarded as a time-keeper with significant clock precision. Technologies for minimizing the atomic clock have been researched. The atomic clock is formed as an oscillator which refers to a transient energy amount of electrons forming an atom such as alkali metal or the like. Especially, a significantly precise value is acquired based on a transient energy of the electrons of the atom of the alkali metal in a state in which there is no disturbance. Compared with a crystal oscillator, it is possible to acquire frequency stability having significant higher figures.

There are some methods for the atomic clock. Among others, an atomic clock of a Coherent Population Trapping (CPT) method has frequency stability of approximately three figures higher than crystal oscillators in related arts, and can be expected to be ultra-minimized and to realize ultra-power consumption (see non-patent documents 1 and 2).

As illustrated in FIG. 1, the atomic clock of the CPT method includes a light source 910 such as a laser element or the like, an Alkaline metal cell 940 in which Alkaline metal is sealed, and a light detector 950 which receives a laser light passing through the Alkaline metal cell 940. The laser light is modulated, and is excited by simultaneously performing two transitions of the electrons in the Alkaline metal atom by sideband wavelengths which appear at both sides of a carrier wave being a specific wavelength. Transit energies in these transitions are constant. When the sideband wavelengths of the laser light correspond to a wavelength respective to the transit energy, a clearing response occurs, in which a light absorption rate in the Alkaline metal is reduced. The atomic oscillator has features in which a carrier wavelength is adjusted so that the light absorption rate due to the Alkaline metal is reduced, a signal detected by the light detector 950 is fed back to a modulator 960, and a modulation frequency of the laser light illuminated from the light source 910 such as a laser element or the like is adjusted by the modulator 960. The laser light is emitted from the light source 910, and irradiates the Alkaline metal cell 940 through a collimate lens 920 and a λ/4 plate 930.

Methods for fabricating the Alkaline metal cell in the micronized atomic clock with a Micro Electro Mechanical Systems (MEMS) technology are disclosed (see patent documents 1 through 4). In these disclosed methods, after an opening is formed on an Si substrate by a photolithography technology and an etching technology, a glass and the Si substrate are anodically bonded. Acnodically bonding is performed at 200° C. through 450° C. by applying voltage of approximately 250 V through 1000 V onto an interface between the glass and the Si substrate. After that, the Alkaline metal and buffer gas are input, and an opening part to form an upper surface is sealed by anodically bonding the glass. The Alkaline metal cell is formed by dicing material formed as described above for each cell.

Various methods are presented to enclose the Alkaline metal in a cell. A non-patent document 3 discloses a method in which Cs (Caesium) metal is directly dropped in vacuum to be sealed. Also, the non-patent document 3 discloses that a liquid solution mixing a $BaN_6$ aqueous solution with CsCl is input into the cell, and a Cs metal is generated by being reacted at 200° C. after the cell is sealed. A non-patent document 4 discloses a method in which a Cs metal is generated by reacting $BaN_6$+CsCl in an ampoule with a heater and is evaporated and transferred into a cell. A non-patent document 5 discloses a method in which after $CsN_3$ is formed as a film in a cell by a general evaporation method, a UV light is irradiated and Cs and $N_2$ are generated. A non-patent document 6 discloses a method in which after a Cs dispenser, which is stable in the atmosphere, is input in a cell, a laser light is irradiated onto the Cs dispenser alone to heat, and Cs is generated. Other methods may be presented.

In a case of sealing the cell by the anodically bond, oxygen, OH, $H_2O$, and the like, which are generated by the anodically bond, react with the Alkaline metal in the cell. For example, in a case of Cs, since $Cs_xO_y$ and the like are generated, permeability of the laser light is fluctuated, and a frequency shift occurs. Thus, there is a problem in which short-term stability of the frequency is degraded.

Patent Documents

Patent Document 1: U.S. Pat. No. 6,806,784

Patent Document 2: U.S. Patent Pub. No. 2005/0007118

Patent Document 3: Japanese Laid-open Patent Application No. 2009-212416

Patent Document 4: Japanese Laid-open Patent Application No. 2009-283526

Non-Patent Documents

Non-Patent Document 1: Applied Physics Letters, Vol. 85, pp. 1460-1462 (2004)

Non-Patent Document 2: Comprehensive Microsystems, vol. 3, pp. 571-612

Non-Patent Document 3: Applied Physics Letters, Vol. 84, pp. 2694-2696 (2004)

Non-Patent Document 4: OPTICS LETTERS, Vol. 30, pp. 2 351-2353 (2005)

Non-Patent Document 5: Applied Physics Letters, Vol. 90, 114106 (2007)

Non-Patent Document 6: J. Micro/Nanolith. MEMS MOEMS 7(3), 033013 (2008)

SUMMARY OF THE INVENTION

The present invention solves or reduces one or more of the above problems.

In one aspect of this disclosure, there is provided an atomic oscillator including an alkali metal cell (also referenced infra as an Alkaline metal cell) in which the alkali metal is sealed, a light source which illuminates a laser beam to the Alkaline metal cell, and a light detector which detects light passing through the Alkaline metal cell, wherein the Alkaline metal cell includes: a first member in which a first glass substrate is bonded on a second surface of a first substrate where a first opening part is formed to penetrate from a first surface to the second surface; a second member in which a second glass substrate is bonded to a fourth surface of a second substrate where a second opening part is formed to penetrate from a third surface to the fourth surface; a cell internal portion which is formed by the first opening part of the first member and the second opening part of the second member by bonding the first surface of the first substrate in the first member to the third surface of the second substrate in the second member, and an alkali metal raw material which is enclosed by the cell internal portion.

In another aspect of this disclosure, there is provided a method for fabricating an atomic oscillator which includes an Alkaline metal cell in which the alkali metal is sealed, a light source which illuminates a laser beam onto the Alkaline metal cell, and a light detector which detects light passing through the Alkaline metal cell, said method including: forming a first opening part which penetrates from a first surface to a second surface of a first substrate and an second opening part which penetrates from a third surface to a fourth surface of a second substrate, the first opening part and the second opening part having approximately the same shape; forming a first member by bonding a first glass substrate to the second surface of the first substrate where the first opening part is formed, and a second member by bonding a second glass substrate to the fourth surface of the second substrate where the second opening part is formed; inputting an alkali metal raw material into the first opening part of the first member or the second opening part of the second member; and bonding a first surface of the first substrate of the first member to a third surface of the second substrate of the second member, wherein a cell internal portion of the Alkaline metal cell is formed by the first opening part of the first member and the second opening part of the second member.

BRIEF DESCRIPTION OF THE DRAWINGS

In the following, embodiments of the present invention will be described with reference to the accompanying drawings.

FIG. 4A through FIG. 4H are diagrams illustrating a process chart of a method for fabricating the atomic oscillator in a second embodiment;

FIG. 7A through FIG. 7F are diagrams illustrating a process chart of a method for fabricating an atomic oscillator in a fourth embodiment;

FIG. 9A through FIG. 9H are diagrams illustrating a process chart of a method for fabricating an atomic oscillator in a fifth embodiment;

DESCRIPTION OF THE PREFERRED EMBODIMENTS

In the following, embodiments according to the present invention will be described with reference to the accompanying drawings. The same members and the like are indicated by the same reference number, and duplicate explanations thereof may be omitted.

First Embodiment

Figure 1:
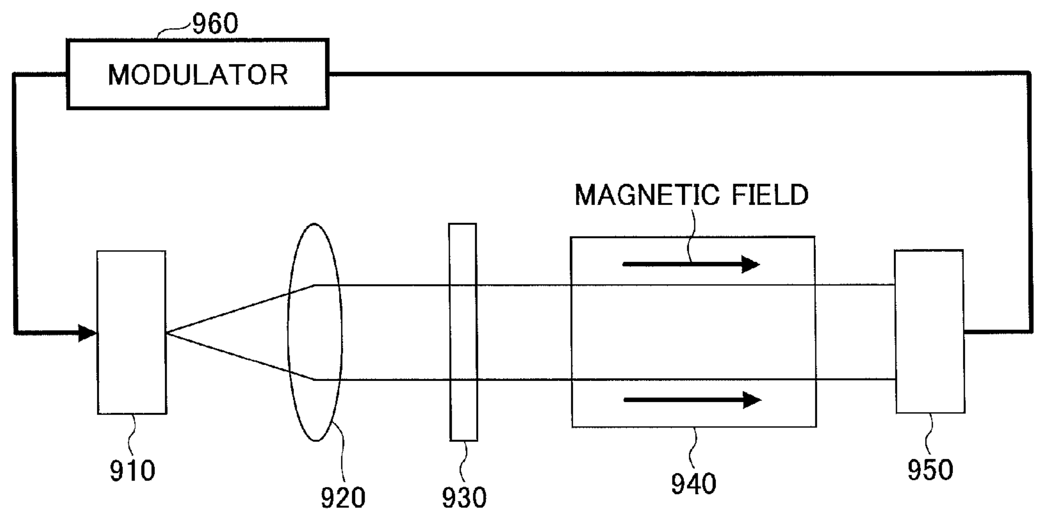
FIG. 1 is a diagram for explaining an atomic oscillator in a first embodiment.
Figure 2:
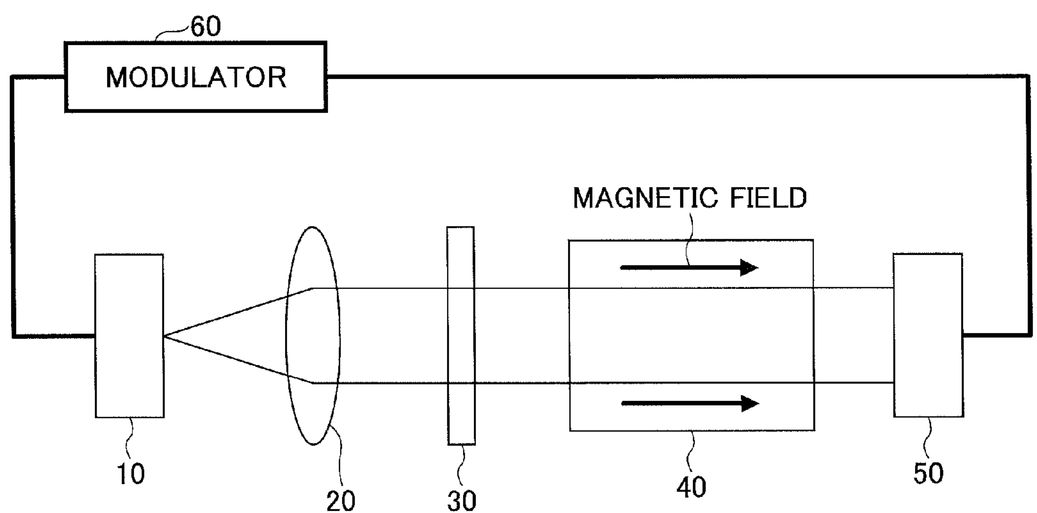
FIG. 2 is a diagram for explaining an atomic oscillator in the first embodiment.

Anatomic oscillator and a method for fabricating the atomic oscillator in a first embodiment will be described. As illustrated in FIG. 2, the atomic oscillator in the first embodiment is regarded as a miniaturized atomic oscillator of a Coherent Population Trapping (CPT) method and includes a light source 10, a collimator lens 20, a $\lambda/4$ plate 30, an Alkaline metal cell 40, a light detector 50, and a modulator 60.

For the light source 10, a laser element of a surface emitting laser element or the like may be used. Cs (Caesium) atom gas is enclosed by the Alkaline metal cell 40 as the alkali metal. A photodiode may be used for the light detector 50.

In the atomic oscillator in the first embodiment, light emitted from the light source 10 is irradiated to the Alkaline metal cell 40 through the collimator lens 20 and the $\lambda/4$ plate 30, and electrons in the alkali metal atom are excited. The light passing through the Alkaline metal cell 40 is detected by the light detector 50, a signal detected by the light detector 50 is fed back to the modulator 60, and the surface emitting laser element in the light source 10 is modulated by the modulator 60.

Next, a method for fabricating the Alkaline metal cell 40 used for the atomic oscillator in the first embodiment will be described with reference to FIG. 3A through FIG. 3H.

Figure 3A:
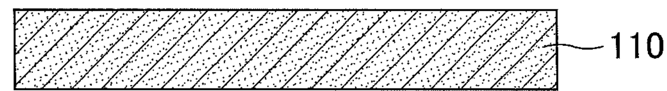
FIG. 3A through FIG. 3H are diagrams illustrating a process chart of a method for fabricating the atomic oscillator in the first embodiment.

First, as illustrated in FIG. 3A, an Si substrate 110 to be a base of the Alkaline metal cell 40 is prepared. The Si substrate 110 is 0.75 mm in thickness and both sides thereof are mirror-finished. In the first embodiment, as described later, since two Si substrates are bonded to form the Alkaline metal cell, two Si substrates 110 are prepared.

Figure 3B:
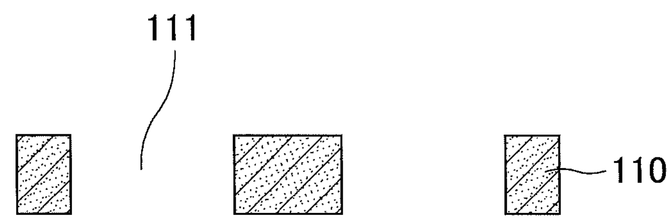

Next, as illustrated in FIG. 3B, opening parts 111 are formed for each of the Si substrates 110. Specifically, a photoresist is coated on a surface of one side for each of the Si substrate 110, is exposed and developed by an aligner, thereby a resist pattern (not depicted) is formed to have openings in an area where the opening parts 111 are formed. After that, by dry etching such as an ICP (Inductively Coupled Plasma) or the like, Si is eliminated in an area where the resist pattern is not formed, and the opening parts 111 penetrating the Si substrate 110 are formed. The dry etching of Si is performed by the Bosch process which etches by alternately supplying $SF_6$ and $C_4F_8$. In the Bosch process, it is possible to perform the etching having higher aeolotropy at high speed. In this etching, power may be 2 kW.

A method, which forms the opening parts 111 by the dry etching, is described above. The opening parts 111 may be formed by wet etching. Specifically, on a surface of the Si substrate 110, a SiN film (not depicted) is formed by a low-pressure Chemical Vapor Deposition (CVD). The photo-resist is coated on the SiN film, and is exposed and developed by the aligner. Accordingly, a resist pattern (not depicted) is formed so as to have openings in the area where the opening parts 111 are formed. After that, the SiN film is eliminated in an area where the resist pattern is not formed, by conducting the dry etching which uses $CF_4$ as an etching gas. Furthermore, by eliminating the resist pattern, a mask of SiN is formed. After that, by conducting the wet etching using KOH (30 wt %) at 85° C., Si is eliminated in an area where the mask formed by SiN is not formed. Thus, the opening parts 111 are formed on the Si substrate 110. Furthermore, after that, the mask formed by SiN is eliminated by performing the wet etching or the like using a liquid solution which dissolves SiN. The wet etching of Si is regarded as an aeolotropic etching, and an inverted slope of a tilt angle 54.7 degrees is formed at a lateral side of each of the opening parts 111.

Figure 3C:
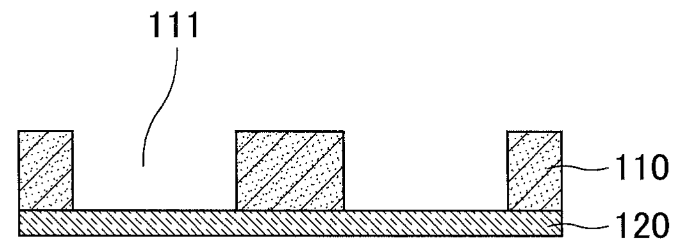

Next, as illustrated in FIG. 3C, a transparent glass substrate 120 is anodically bonded to another surface of the Si substrate 110 where the opening parts 111 are formed. Specifically, in a vacuum chamber, the glass substrate 120 is contacted to the other surface of the Si substrate 110 on which the opening parts 111 are formed, and is anodically bonded by applying −800 V to the glass substrate 120 at 380 C. In this case, since raw material of the alkali metal or the like are not arranged, there is no problem in which the alkali metal is oxidized due to oxygen or the like occurred by the anodically bonding. In the first embodiment, since two Si substrates are bonded, one more Si substrate having the same configuration is produced. Accordingly, the opening parts 111 of approximately the same shape are formed on both Si substrates. In the first embodiment, two members, each formed by the Si substrate 110 to which the glass substrate 120 is anodically bonded, are formed. Later, one of the Si substrates 110 may be referred as a first member 101, and another one of the Si substrates 110 may be referred as a second member 102.

Figure 3D:
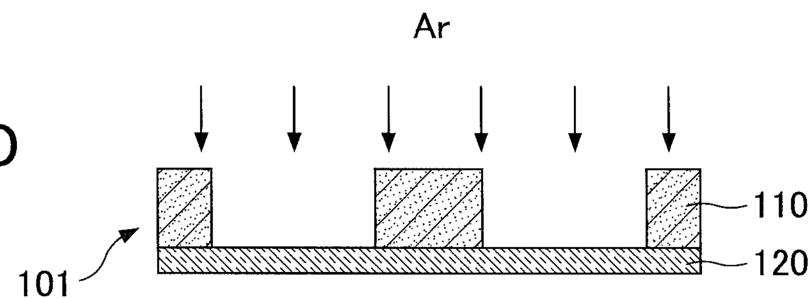

Next, as illustrated in FIG. 3D, on each of the Si substrates 110, deposits adhered on one surface to which the glass substrate 120 is not bonded are removed. Specifically, a member formed by the Si substrate 110 to which the glass substrate 120 is bonded are arranged in each of two vacuum chambers. After the vacuum chambers are evacuated, an Ar ion beam is irradiated onto one surface of each of the two Si substrates 110 in vacuum. Therefore, an activation treatment is performed to the one surface of each of the two Si substrates 110 by eliminating a natural oxide film and the deposits adhered on the one surface of each of the two Si substrates 110. As described above, a plasma activation treatment is conducted on the one surface of each of the two Si substrates 110. In FIG. 3D, the first member 101 alone is illustrated. The same treatment is performed for the second member 102.

Figure 3E:
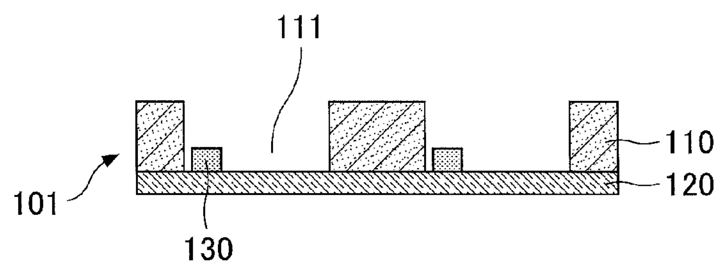

Next, as illustrated in FIG. 3E, alkali metal raw material 130 such as Cs, Rb, or the like is input into the opening parts 111 of the Si substrate 110 on the first member 101.

Figure 3F:
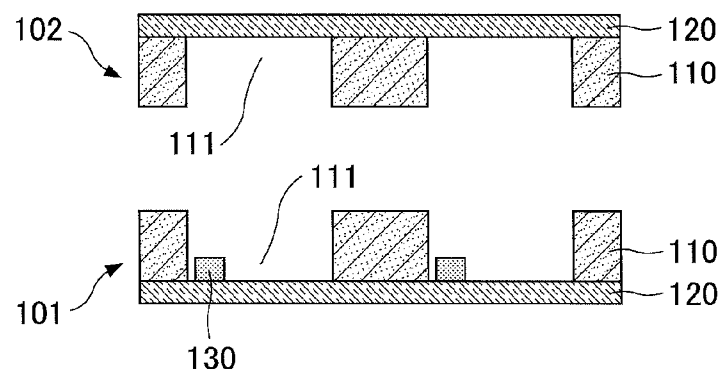

Next, as illustrated in FIG. 3F, the first member 101 and the second member 102 are aligned so that the one surfaces of the two Si substrates 110, that is, the surfaces, on which the activation treatment is performed, are facing each other. Specifically, a positioning is conducted so that the opening parts 111 on the first member 101 corresponds to the opening parts 111 on the second member 102.

Figure 3G:
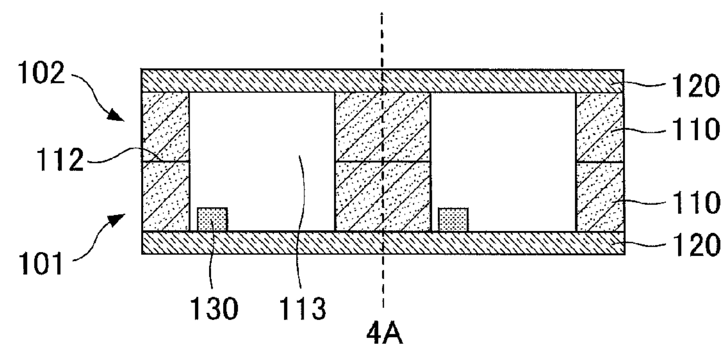

Next, as illustrated in FIG. 3G, Nitrogen used as the buffer gas is introduced into a vacuum chamber to produce a nitrogen atmosphere. In the nitrogen atmosphere, the first member 101 and the second member 102 are bonded to each other. Specifically, the plasma activation treatment is performed on one surface of the Si substrate 110 on the first member 101 and one surface of the Si substrate 110 on the second member 102. Thus, by contacting and applying pressure, the one surface of the Si substrate 110 on the first member 101 is bonded to the one surface of the Si substrate 110 on the second member 102 at normal temperature due to Si—Si direct bonding. The direct bonding corresponds to a state in which bonds of atoms on a surface of one substrate are bonded with the bonds of atoms on a surface of another substrate without interferences of other atoms. As described above, by bonding surfaces of the two Si substrates 110 on bonding areas 112, cell internal portions 113, which are formed by two opening parts 111 of the first member 101 and the second member 102, are formed. In the Si—Si direct bonding described above, gas such as oxygen is not produced. In a bonding process, there is no case in which impurities such as oxygen or the like enter the cell internal portions 113 each sealing the alkali metal raw material 130.

Figure 3H:
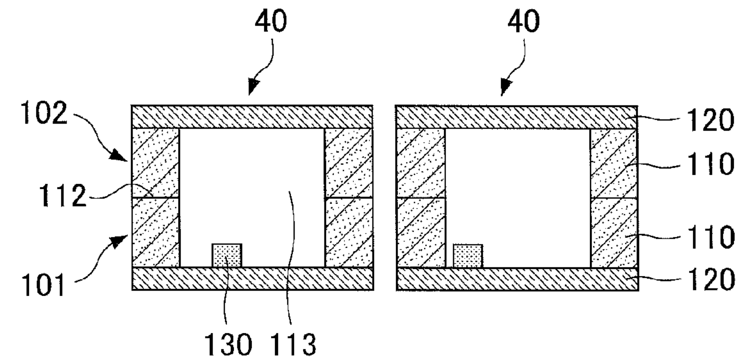

Next, as illustrated in FIG. 3H, each cell is separated at a dashed line 4A illustrated in FIG. 3G in a state in which the first member 101 and the second member 102 are bonded to each other. The Alkaline metal cell 40 is formed.

By this configuration, the Alkaline metal cell 40 is produced to use for the atomic oscillator in the first embodiment. Since the Alkaline metal cell 40 produced by the above described process includes a fewer amount of impurities such as oxygen included in the cell internal portions 113, it is possible to acquire a highly stabilized atomic oscillator.

In the gas cell using a Micro Electro Mechanical Systems (MEMS) technology for the atomic oscillator by the CPT, a space between two glasses facing each other becomes a light path for a laser beam to pass in the cell. A light path length corresponds to a length of the space for the laser beam to pass, and may be approximately 1.5 mm conventionally at maximum. The longer the light path length is, the greater the number of atoms, which contributes for the laser beam to be absorbed while the laser beam is passing through the Alkaline metal cell, is increased. A S/N (Signal to Noise ratio) is preferably improved.

Furthermore, in the first embodiment, a distance between two glass substrates 120 forming the Alkaline metal cell 40 corresponds to thicknesses of the two Si substrates 110. Thus, it is possible to easily form the distance to be wider between the two glass substrates 120. Specifically, in a case of forming opening parts by etching one plate of a thick Si substrate, for example, an Si substrate being 1.5 mm in thickness, since the Si substrate 110 is thick, a workload becomes greater when the opening parts 111 are formed. In addition, the opening parts 111 may not be formed in a desired shape. However, in the first embodiment, the opening parts 111 are formed by etching both Si substrates 110 being half thickness, that is, 0.75 mm in thickness. Advantageously, it is possible to reduce workload for forming the opening parts 111, to easily form a gas cell by the MEMS technology so that the light path length is greater than 1.5 mm, and the like.

In the alkali metal raw material 130, as raw material in a case in which the alkali metal is Cs, a chemical compound stable in the atmosphere including Cs metal and Cs may be used. As the alkali metal raw material 130, in a case of using the chemical compound stable in the atmosphere including Cs metal and Cs, after the alkali metal raw material 130 is enclosed in the cell internal portions 113, Cs is generated by heating or the like. For example, as the alkali metal raw material 130, in a case of using a liquid solution mixing of a $BaN_6$ aqueous solution with CsCl, after the liquid solution mixing the $BaN_6$ aqueous solution with CsCl is enclosed in the cell internal portions 113, Cs is generated by reacting the liquid solution at 200° C. Moreover, as the alkali metal raw material 130, in a case of using $CsN_3$, a $CsN_3$ film is formed in the cell internal portions 113 by the general evaporation method. After $CsN_3$ is enclosed in the cell internal portions 113, an ultraviolet (UV) light is irradiated, and $N_2$ including Cs and the buffer gas is generated. Also, as the alkali metal raw material 130, in a case of using a Cs dispenser which is stable in the atmosphere, after the Cs dispenser is input into the cell internal portions 113, the laser beam is irradiated to the Cs dispenser alone to heat. Thus, Cs is generated.

Cs, Rb, and the like being the alkali metal intensively react with oxygen, $H_2O$, and the like. Accordingly, in a case of inputting Cs metal itself into the cell internal portions 113, even if Cs raw material is sealed after the Cs raw material is put into the vacuum chamber, a slight amount of the oxygen, $H_2O$, or the like resides in the vacuum chamber. Thus, Cs is oxidized. It is difficult to completely prevent Cs from being oxidized. On the contrary, in a case of using a chemical compound of Cs stable in the atmosphere as the alkali metal raw material 130, by a method for generating Cs by heat or the like after the alkali metal raw material 130 is sealed in the cell internal portions 113, it is possible to significantly suppress oxidization of Cs. Thus, it is possible to further improve the frequency stability of the atomic oscillator.

Moreover, in a case of enclosing the alkali metal raw material 130 in the cell internal portions 113, instead of enclosing the alkali metal raw material 130 in the atmosphere, as described above, it is preferable to enclose the alkali metal raw material 130 with the buffer gas such as $N_2$. In the alkali metal in the cell internal portions 113, an internal state of the alkali metal atoms changes when the alkali metal atoms collide with walls of the cell internal portions 113. In a case of using the alkali metal for the atomic oscillator, the frequency stability is reduced. By enclosing the buffer gas in the cell internal portions 113, preferably, it is possible to reduce the probability for the Alkaline alkali metal atoms to collide with the walls of the cell internal portions 113, and to suppress deterioration of the frequency stability. As the buffer gas, Nitrogen, an inert gas, and the like are preferable. For example, $N_2$, Ne, Ar, Ne—Ar mixed gas, and the like may be used.

Second Embodiment

Next, a second embodiment will be described. In the second embodiment, an atomic oscillator including an Alkaline metal cell different from the first embodiment and a method for fabricating the same will be described with reference to FIG. 4A through FIG. 4H. In FIG. 4A through FIG. 4H, elements that are the same as those illustrated in the previously described figures are indicated by the same reference numerals and the explanation thereof will be omitted.

First, as illustrated in FIG. 4A, the Si substrate 110 is prepared. The Si substrate 110 is 1 mm in thickness and both sides thereof are mirror-finished. In the second embodiment, as described later, by bonding two Si substrates 110, the Alkaline metal cells are formed. Thus, two Si substrates 110 are prepared.

Next, as illustrated in FIG. 4B, a metal film 210 is formed in a predetermined area of one surface of one Si substrate 110. The metal film 210 is formed in areas other than areas where the opening parts 111, which will be described later, are formed, that is, in areas to be bonding areas which will be described later. Specifically, the metal film 210 is regarded as a laminated film being Au of 700 nm or Cr of 10 nm, and is formed by sputtering, vacuum deposition, and the like. As a method for forming the metal film 210 in the predetermined area, after an Au film or a Cr film is formed, a resist pattern is formed in the areas where the metal film 210 is formed, and the Au film or the Cr film, which is formed in areas where the resist pattern is not formed, is eliminated by etching. Alternatively, a lift-off or the like may be performed to form the metal film 210. That is, a resist pattern, which includes opening parts 111 in areas where the metal film 210 is formed, is formed on one surface of the Si substrate 110. After that, the Au film or the Cr film is formed. Then, the Au film or the Cr film, which is formed on the resist pattern by an organic solvent, or the like, is eliminated with the resist pattern.

Next, as illustrated in FIG. 4C, the opening parts 111 are formed on the Si substrate 110. Specifically, the photo-resist is coated on one surface where the metal film 210 is formed on the Si substrate 110. By exposing and developing by the aligner, a resist pattern (not depicted) including openings in areas where the opening parts 111 is formed. After that, by etching such as the ICP or the like, Si is eliminated in an area where the resist pattern is not formed, and the opening parts 111 penetrating the Si substrate 110 are formed. The dry etching of Si is conducted by the Bosch process which performs the etching by alternately supplying $SF_6$ and $C_4F_8$.

Next, as illustrated in FIG. 4D, the transparent glass substrate 120 is anodically bonded to another surface of the Si substrate 110 where the opening parts 111 are formed. Specifically, in the vacuum chamber, the glass substrate 120 is contacted to the other surface of the Si substrate 110 on which the opening parts 111 are formed, and is anodically bonded by applying −800 V to the glass substrate 120 at 380° C. A member formed as described above may be referred as a first member 201 including the Si substrate 110 to which the glass substrate 120 is bonded. In the second embodiment, two Si substrates are bonded to each other. The second member 102 in the second embodiment is formed in the same manner as the method for forming the second member 102 in the first embodiment.

Figure 4E:
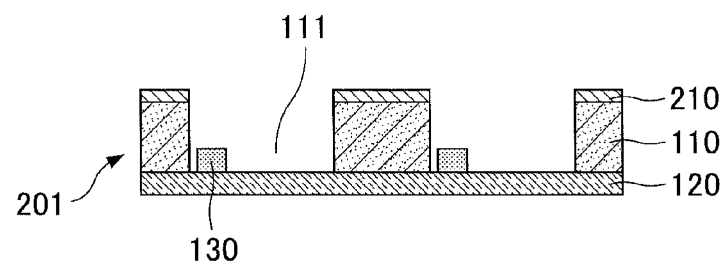

Next, as illustrated in FIG. 4E, in the first member 201, the alkali metal raw material 130 such as Cs, Rb, or the like is input to the opening parts 111 of the Si substrate 110.

Figure 4F:
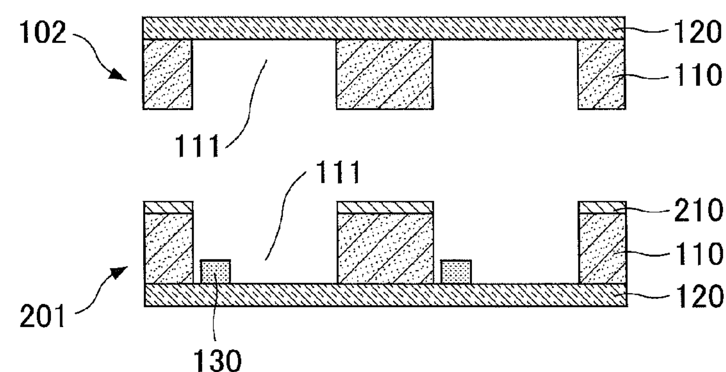

Next, as illustrated in FIG. 4F, the positioning is conducted to face a surface where the metal film 210 of the first member 201, to a face where the Si substrate 110 of the second member 102 is exposed. For the second member 102, just before the positioning, on one surface of the Si substrate 110 where the glass substrate 120 is not bonded, the deposits and an oxide film are eliminated by performing a light etching using hydrofluoric acid.

Figure 4G:
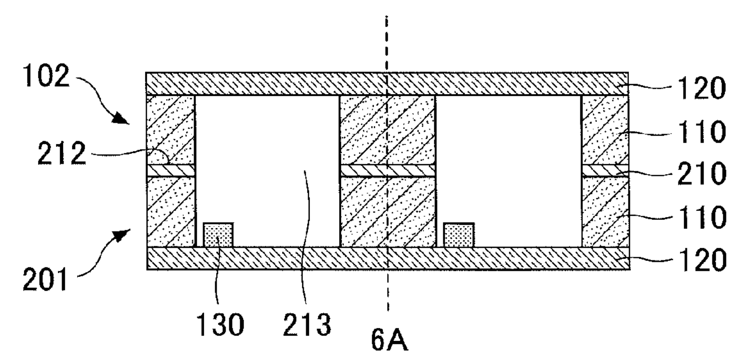

Next, as illustrated in FIG. 4G, Nitrogen used as the buffer gas is introduced into the vacuum chamber to produce the nitrogen atmosphere. In the nitrogen atmosphere, the first member 201 and the second member 102 are bonded through the metal film 210 by eutectic bonding of a metal-Si. Specifically, in the vacuum chamber, the metal film 210, which is formed on one surface of the Si substrate 110 in the first member 201 is contacted to one surface of the Si substrate 110 in the second member 102. At 400 C, a pressure treatment is conducted for 20 minutes with 15 kN. Thus, an eutectic crystal of the metal-Si is formed in a bonding area 212. The first member 201 and the second member 102 are bonded by the eutectic bonding. As described above, each of cell internal portions 213 is formed by two opening parts 111 of the first member 201 and the second member 102. In the eutectic bonding of the metal-Si described above, gas such as oxygen is generated. Thus, during the eutectic bonding, there is no case in which impurities such as oxygen or the like enter the cell internal portions 213 in which the alkali metal raw material 130 is sealed.

Figure 4H:
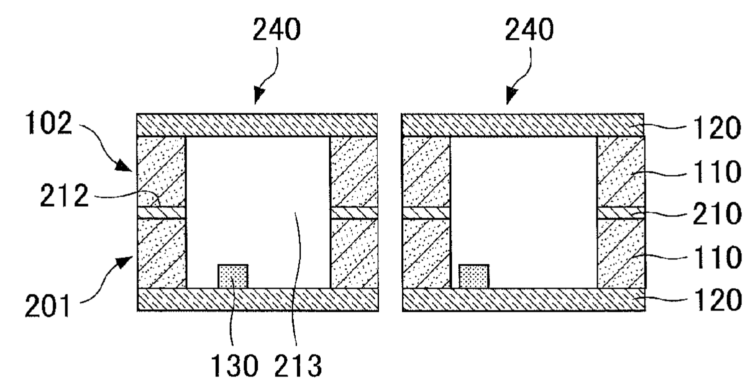

Next, as illustrated in FIG. 4H, a member where the first member 201 and the second member 102 are bonded is divided along a dashed line 6A illustrated in FIG. 4G, so as to separately form each of the Alkaline metal cells 240.

By this configuration, it is possible to produce the Alkaline metal cells 240 to be used for the atomic oscillator in the second embodiment. In the Alkaline metal cells 240 fabricated as described above, since an amount of the impurities such as oxygen included in the cell internal portions 213 is fewer, it is possible to acquire a highly stable atomic oscillator.

In the atomic oscillator in the second embodiment, the Alkaline metal cell 40 of the atomic oscillator in the first embodiment is replaced with the Alkaline metal cell 240. Also, as the metal film 210, other than Au and Cr, Au—Sn (alloyed metal), Au, or the like may be used.

Moreover, in the second embodiment, the Alkaline metal cell 240 may be fabricated by using a second member 202 in which the metal film 210 is formed similarly to the first member 201. In this case, the second member 202 is fabricated by a method similar to the method for the first member 201. A fabrication method of this case is the same as previously described with reference to FIG. 4A through FIG. 4E excluding the second member 102. Subsequent fabrication steps will be described with reference to FIG. 5A through FIG. 5C.

Figure 5A:
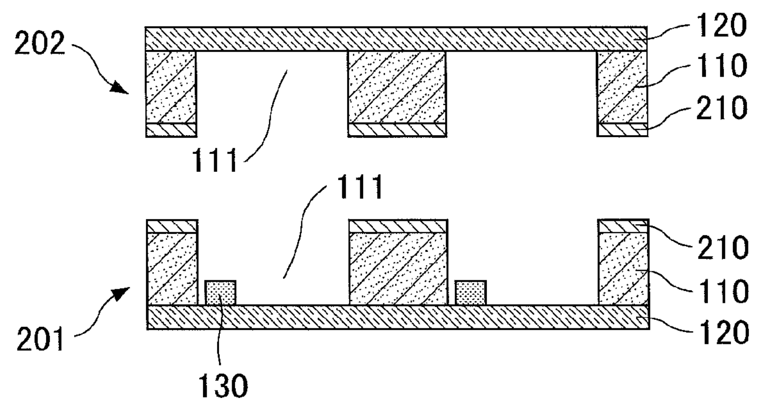
FIG. 5A through FIG. 5C are diagrams illustrating a process chart of another method for fabricating the atomic oscillator in the second embodiment.

After a step depicted in FIG. 4E, as illustrated in FIG. 5A, the positioning is conducted so as to face a surface where the metal film 210 of the first member 201 to a surface where the metal film 210 of the second member 202 is formed.

Figure 5B:
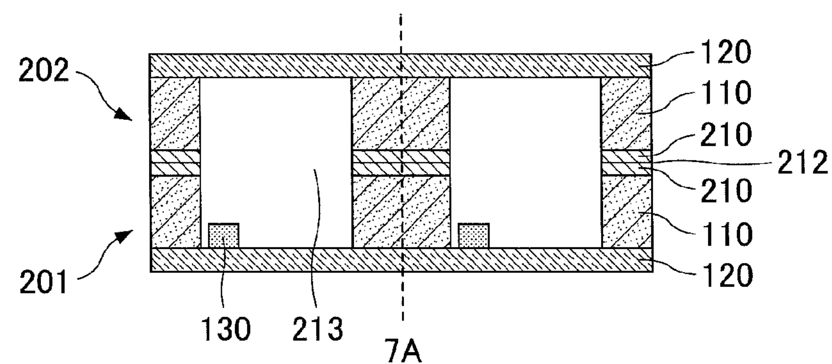

Next, as illustrated in FIG. 5B, Nitrogen used as the buffer gas is introduced into the vacuum chamber to produce the nitrogen atmosphere. In the nitrogen atmosphere, the first member 201 and the second member 202 are bonded with the each other's metal films 210. Specifically, in the vacuum chamber, the metal film 210 in the first member 201 is contacted to the metal film 210 in the second member 202. The metal films 210 are bonded due to direct bonding thereof, by being pressed and heated. As described above, by the direct bonding of the metal films 210 in the bonding areas 212, each of the cell internal portions 213 is formed by two opening parts 111. In a case of bonding metals to each other as described above, gas such as oxygen or the like is not produced. Thus, in the second embodiment, when the metal films are bonded, the impurities such as oxygen or the like do not enter the cell internal portions 213 in which the alkali metal raw material 130 is sealed. In a case of bonding the metals 210 to each other, it is preferable for both the metal films 210 to be formed by metal material including Au (Gold) or Au.

Figure 5C:
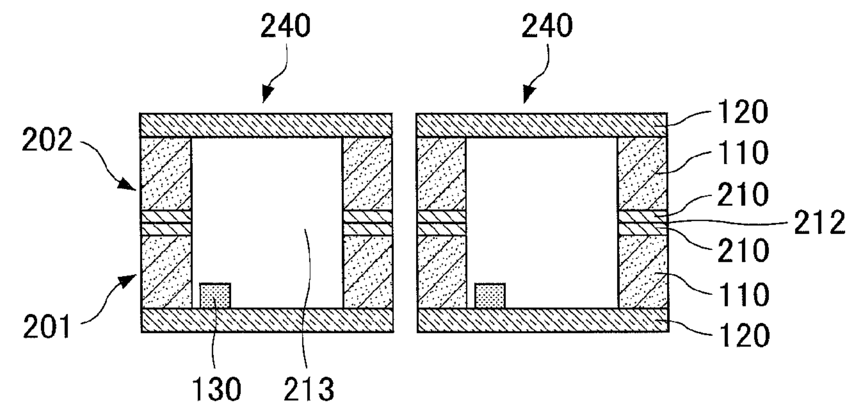

Next, as illustrated in FIG. 5C, a member where the first member 201 and the second member 202 are bonded is divided along a dashed line 7A illustrated in FIG. 5B, so as to separately form each of the Alkaline metal cells 240.

Moreover, in the second embodiment, a distance (light path length) is approximately 2 mm between two glass substrates 120 forming each of the Alkaline metal cells 240. Conventionally, the distance is approximately 1.5 mm. Since the distance corresponds to thickness of two Si substrates 110, it is possible to easily form the distance between two glass substrates 120 to be greater.

Descriptions other than the above are the same as those in the first embodiment.

Third Embodiment

Next, the third embodiment will be described. In the third embodiment, an atomic oscillator including Alkaline metal cells different from those in the first and second embodiments and a method for fabricating the same will be described with reference to FIG. 6A through FIG. 6H. In FIG. 6A through FIG. 6H, elements that are the same as those illustrated in the previously described figures are indicated by the same reference numerals and the explanation thereof will be omitted.

Figure 6A:
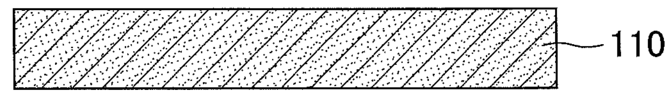
FIG. 6A through FIG. 6H are diagrams illustrating a process chart of a method for fabricating an atomic oscillator in a third embodiment.

First, as illustrated in FIG. 6A, the Si substrate 110 is prepared. The Si substrate 110 is 1 mm in thickness, and both sides thereof are mirror-finished. In the third embodiment, as described later, since three Si substrates are bonded to form the Alkaline metal cell, three Si substrates 110 are prepared.

Figure 6B:
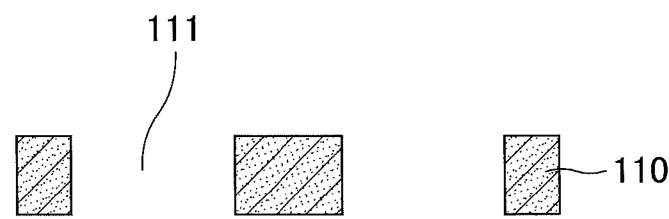

Next, as illustrated in FIG. 6B, the opening parts 111 are formed to each of three Si substrates 110. Specifically, the photo-resist is coated on one surface of each of the Si substrates 110. By exposing and developing by the aligner, a resist pattern including openings (not depicted) is formed in the areas where the opening parts 111 are formed. After that, by eliminating Si by the dry etching such as the ICP in the areas where the resist pattern is not formed, the opening parts 111 are formed to penetrate the Si substrate 110. The dry etching of Si is performed by the Bosch process which conducts the etching by alternately supply $SF_6$ and $C_4F_6$.

Figure 6C:
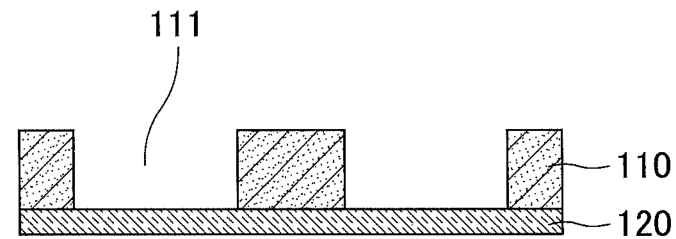

Next, as illustrated in FIG. 6C, in three Si substrates where the opening parts 111 are formed, the transparent glass substrate 120 is anodically bonded to each of other surfaces of two Si substrates 110. Specifically, in the vacuum chamber, the glass substrate 120 is contacted to the another surface of each of two Si substrates 110 on which the opening parts 111 are formed, and is anodically bonded by applying −800 V to the glass substrate 120 at 380° C. In the third embodiment, two members, each including the Si substrate 110 where the glass substrate 120 is bonded, is formed. One member may be referred to as a first member 301, and another member may be referred as a second member 302. Also, an Si substrate, where the glass substrate 120 is not bonded, is referred as an Si substrate 110*a*.

Figure 6D:
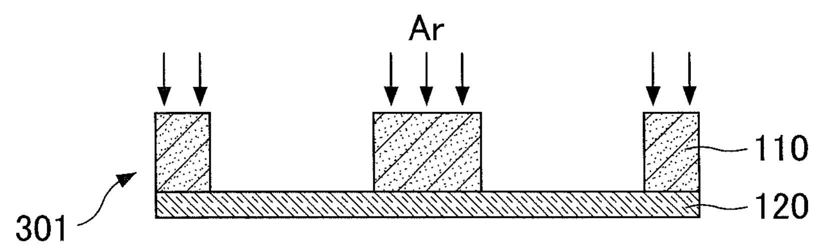

Next, as illustrated in FIG. 6D, the deposits, which are adhered on bonding surfaces of the first member 301 including the Si substrate 110 where the glass substrate 120 is bonded, and an other Si substrate 110*a* where the opening parts 111 are formed. Specifically, the first member 301 and the Si substrate 110*a* where the opening parts 111 are formed are arranged in the vacuum chamber. After the inside of the vacuum chamber is evacuated, the Ar ion beam is irradiated on surfaces of the Si substrates 110 and 110*a* which are the bonding surfaces in vacuum. The natural oxide film and the deposits are adhered on the surfaces of the Si substrates 110 and 110*a* which are to be the bonding surfaces. By the above described processes, the natural oxide film and the deposits are removed, so as to conduct the activation treatment for the surfaces. That is, the plasma activation treatment is performed on both the surfaces to be the bonding surfaces of the first member 301 and the Si substrate 110*a*.

Figure 6E:
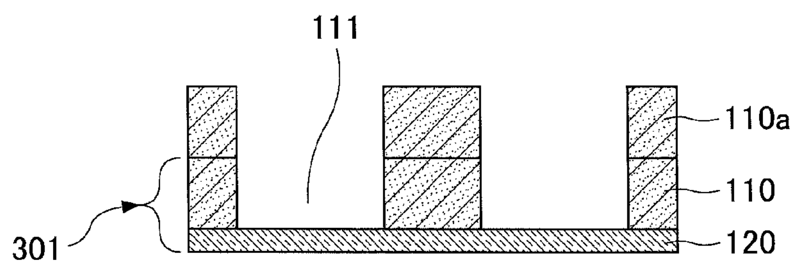

Next, as illustrated in FIG. 6E, by contacting and pressing the surfaces to each other on which the activation treatment is performed, the first member 301 is bonded to the Si substrate 110*a* by the Si—Si direct bonding.

Figure 6F:
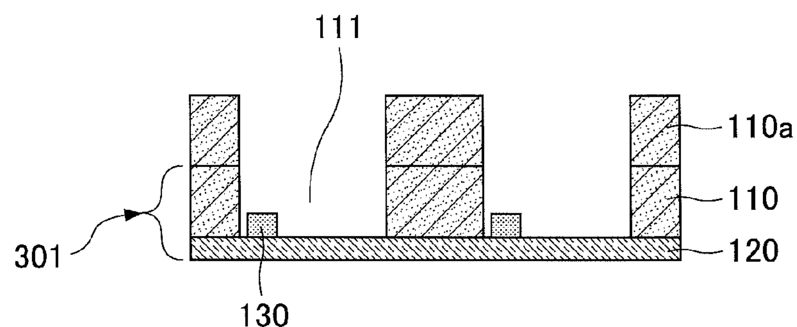

Next, as illustrated in FIG. 6F, the alkali metal raw material 130 such as Cs, Rb, or the like is input to the opening parts 111 in the first member 301.

Figure 6G:
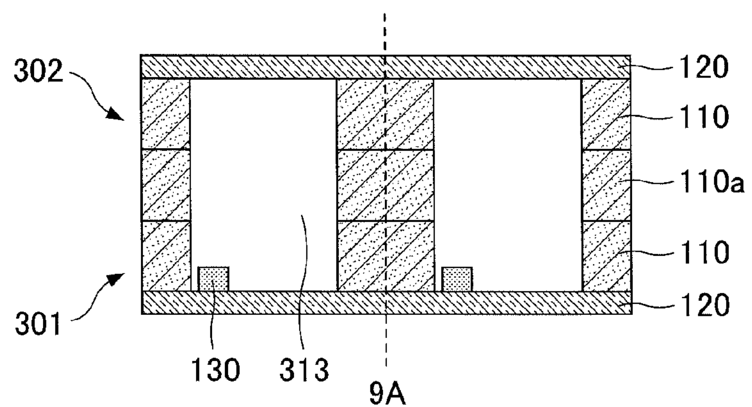

Next, as illustrated in FIG. 6G, Nitrogen used as the buffer gas is introduced into the vacuum chamber to produce a nitrogen atmosphere. In the nitrogen atmosphere, the Si substrate 110*a* where the opening parts 111 are formed is bonded to the second member 302. Specifically, not depicted, the Ar ion beam is irradiated onto both bonding surfaces of the second member 302 and the Si substrate 110*a* where the opening parts 111 are formed. The activation treatment is conducted for the bonding surfaces by eliminating the natural oxide film and the deposits which are adhered onto the bonding surfaces of the Si substrate 110 and the Si substrate 110*a*. After that, by contacting and pressing each other's surfaces where the activation treatment is performed, the second member 302 and the Si substrate 110*a* where the opening parts 111 are bonded by the Si—Si direct bonding. In the Si—Si direct bonding, the gas such as oxygen or the like is not generated. Thus, the impurities such as oxygen and the like do not enter cell internal portions 313 where the alkali metal raw material 130 is sealed. As described above, the cell internal portions 313 are formed by the opening parts 111 of the first member 301, the opening parts 111 of the Si substrate 110*a*, and the opening parts 111 of the second member 302.

Figure 6H:
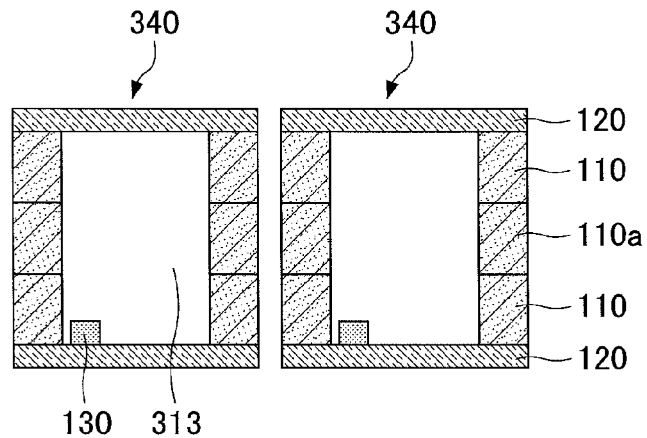

Next, as illustrated in FIG. 6H, a member, in which the first member 301, the Si substrate 110*a* where the opening parts 111 are formed, and the second member 302 are bonded, is divided along a dashed line 9A illustrated in FIG. 6G, so as to separately form each of the Alkaline metal cells 340.

By the above describe process, it is possible to fabricate the Alkaline metal cells 340 used for the atomic oscillator in the third embodiment. In the Alkaline metal cells 340 fabricated as described above, since the amount of the impurities such as oxygen and the like included in the cell internal portions 313 is less, it is possible to acquire the highly stable atomic oscillator.

It is possible to acquire the atomic oscillator in the third embodiment by replacing the Alkaline metal cells of the atomic oscillator in the first embodiment with the Alkaline metal cells 340. In the third embodiment, since three Si substrates 110 and 110*a* being 1 mm in thickness are bonded, the distance (light path length) between two glass substrates 120 forming the Alkaline metal cells 340 is approximately 3 mm. A case of using three Si substrates 110 and 110*a* is described above. Also, it is possible to similarly form the Alkaline metal cells 340 for a case of using more than four Si substrates 110 and 110*a*. In the third embodiment, by increasing the number of the Si substrates 110 and 110*a* to form the Alkaline metal cells 340, it is possible to easily form the light path length of the laser beam passing through the Alkaline metal cells 340 to be longer.

Descriptions other than the above are the same as those in the first embodiment.

Fourth Embodiment

Next, a fourth embodiment will be described. In the fourth embodiment, an atomic oscillator including an Alkaline metal cell different from those in the first through third embodiments and a method for fabricating the same will be described with reference to FIG. 7A through FIG. 7F and FIG. 8A and FIG. 8B. In FIG. 7A through FIG. 7F and FIG. 8A and FIG. 8B, elements that are the same as those illustrated in the previously described figures are indicated by the same reference numerals and the explanation thereof will be omitted.

First, as illustrated in FIG. 7A, Si substrates 410*a* and 410*b* to be bases are prepared. The Si substrates 410*a* and 410*b* have the same configuration in which the thickness is 1 mm and both sides thereof are mirror-finished.

Next, as illustrated in FIG. 7B, opening parts 411*a* and 411*b* are formed on the Si substrate 410*a*, and opening parts 411*a*, 411*b*, and 411*c* are formed on the Si substrate 410*b*. By these formations, as illustrated in FIG. 8A, the opening part 411*a* and the opening part 411*b* are separately formed on the Si substrate 410*a*. As illustrated in FIG. 8B, the opening part 411*a* and the opening part 411*b* are formed to be connected by the opening part 411*c* on the Si substrate 410*b*. The opening part 411*c* is formed to be a cell connection part, and is formed by a thin groove through which Cs atomic gas may pass but a Cs chemical compound is not allowed to pass. FIG. 7B illustrates a cross-sectional surface of the Si substrate 410*a* sectioned by a dashed line 12A-12B in FIG. 8A and a cross-sectional surface of the Si substrate 410*b* sectioned by a dashed line 12C-12D.

Next, as illustrated in FIG. 7C, a first member 401 is fabricated by anodically bonding the glass substrate 120 onto the Si substrate 410*a*, and a second member 402 is fabricated by anodically bonding the glass substrate 120 onto the Si substrate 410*b*.

Figure 7D:
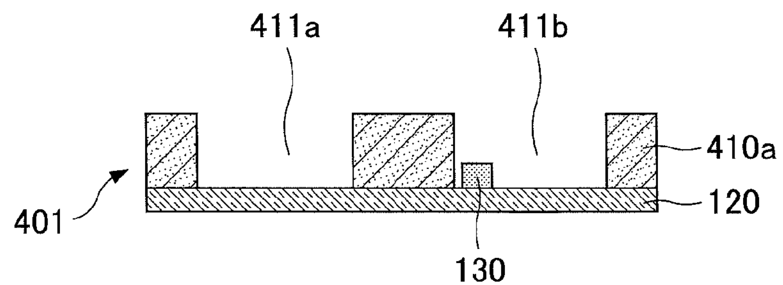
Figure 8A:
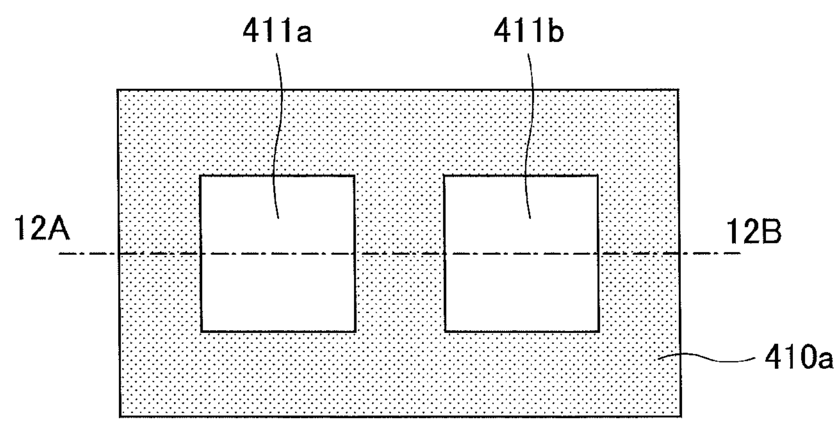
FIG. 8A and FIG. 8B are diagram for explaining the method for fabricating the atomic oscillator in the fourth embodiment.
Figure 8B:
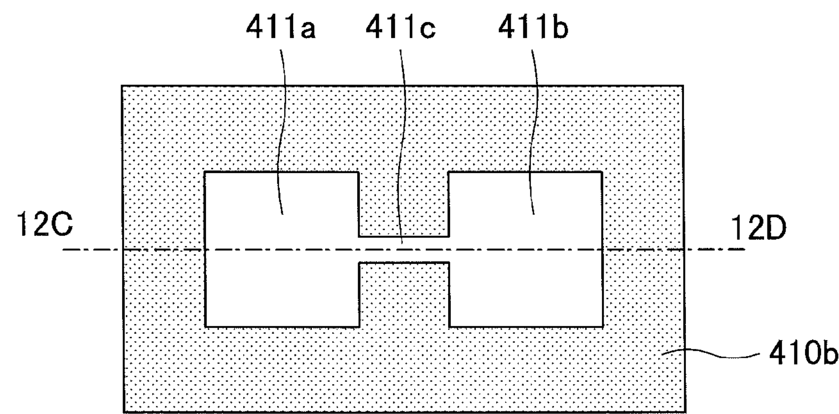

Next, as illustrated in FIG. 7D, the alkali metal raw material 130 such as Cs, Rb, or the like is input into the opening parts 411*b* of the Si substrate 410*a* on the first member 401. In the first member 401, the deposits (not depicted), which are adhered on a surface of the Si substrate 410*a* where the glass substrate 120 is not bonded, are eliminated by illuminating the Ar ion beam. In the second member 402, the deposits (not depicted), which are adhered on the surface of the Si substrate 410*b* where the glass substrate 120 is bonded, are eliminated by illuminating the Ar ion beam. Thereby, the plasma activation treatment is performed with respect to the bonding surfaces of the first member 401 and the second member 402.

Figure 7E:
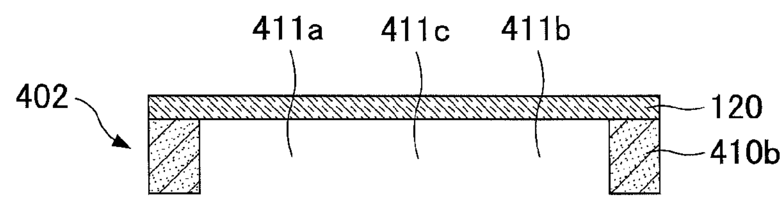

Next, as illustrated in FIG. 7E, the positioning is conducted so as to face a surface of the first member 401 to a surface of the second member 402.

Figure 7F:
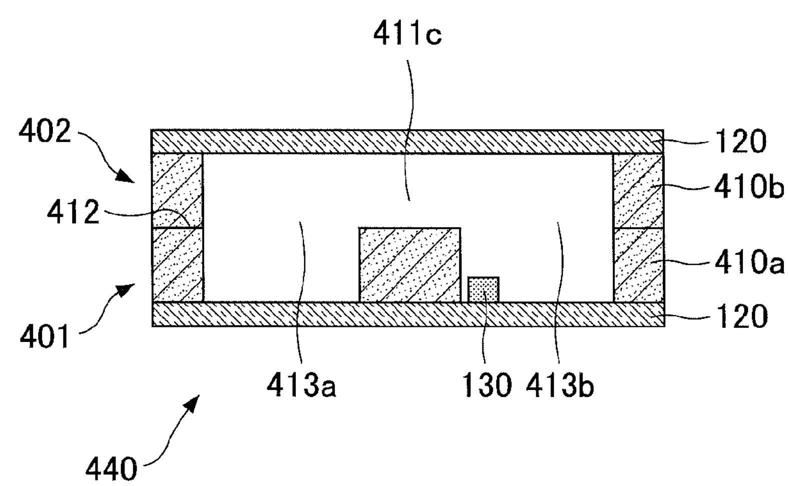

Next, as illustrated in FIG. 7F, Nitrogen used as the buffer gas is introduced into the vacuum chamber to produce the nitrogen atmosphere. In the nitrogen atmosphere, by bonding the first member 401 to the second member 402, the Alkaline metal cell 440 is formed. Specifically, the plasma activation treatment is performed for both surfaces where the first member 401 is bonded to the second member 402. By contacting and pressing the members 401 and 402 each other, the first member 401 and the second member 402 are bonded by Si—Si direct bonding. In these processes, by bonding the first member 401 to the second member 402 on bonding areas 412, a first cell internal portion 413*a* is formed by two opening parts 411*a*, and a second cell internal portion 413*b* is formed by two opening parts 411*b*. The first cell internal portion 413*a* and the second cell internal portion 413*b* are connected by the opening part 411*c* to be the cell connection part. The alkali metal raw material 130 is arranged in the second cell internal portion 413*b*.

In the Alkaline metal cell 440 in the fourth embodiment, the alkali metal is generated by heat or the like. Gas of the alkali metal being generated passes the opening part 411*c* to be the cell connection part, and is used in a state of entering the first cell internal portion 413*a*. Accordingly, in the atomic oscillator in the fourth embodiment, light is illuminated to the first cell internal portion 413*a* of the Alkaline metal cell 440.

For the alkali metal raw material 130 used in the fourth embodiment, the chemical compound stable in the atmosphere including Cs may be used when the alkali metal is Cs. Specifically, in a case of using the liquid solution mixing the $BaN_6$ aqueous solution with CsCl as the alkali metal raw material 130, after being enclosed in the second cell internal portion 413*b*, the liquid solution mixing the $BaN_6$ aqueous solution with CsCl is reacted at 200° C. to generate Cs. Also, in a case of using $CsN_3$ as the alkali metal raw material 130, the $CsN_3$ film is formed in the second cell internal portion 413*b* by the general evaporation method. After $CsN_3$ is enclosed in the second cell internal portion 413*b*, the UV light is irradiated to generate Cs and $N_2$ to be the buffer gas. Also, as the alkali metal raw material 130, in a case of using the Cs dispenser which is stable in the atmosphere, after the Cs dispenser is input into the second cell internal portion 413*b* and is sealed, the laser beam is irradiated onto the Cs dispenser alone to heat. Then, Cs is generated.

In the fourth embodiment, since only the alkali metal such as Cs or the like and the buffer gas reside in the first cell internal portion 413*a*, it is possible to further improve the frequency stability of the atomic oscillator.

In the fourth embodiment, since two Si substrates 410*a* and 410*b* being 1 mm in thickness are bonded to each other, the distance between two glass substrates 120 forming the Alkaline metal cell 440 is approximately 2 mm.

Descriptions other than the above are the same as those in the first embodiment.

Fifth Embodiment

Next, a fifth embodiment will be described. In the fifth embodiment, an atomic oscillator including an Alkaline metal cell different from those in the first through fourth embodiments and a method for fabricating the same will be described with reference to FIG. 9A through FIG. 9H.

With reference to FIG. 9A through FIG. 9H, the method for fabricating an Alkaline metal cell 540 used for the atomic oscillator in the fifth embodiment will be described.

First, as illustrated in FIG. 9A, the Si substrate 110 is prepared. The Si substrate 110 is 1 mm in thickness, and both sides thereof are mirror-finished. In the fifth embodiment, as described later, since two Si substrates are bonded to form the Alkaline metal cell, two Si substrates 110 are prepared.

Next, as illustrated in FIG. 9B, one surface of each of the two Si substrates 110 is etched, and concave portions 511*a* are formed. Specifically, the photo-resist is coated onto the one surface of the Si substrate 110. By exposing and developing by the aligner, the resist pattern (not depicted) including the openings in areas where the concave portions 511*a* are formed. After that, Si in the area where the resist pattern is not formed is eliminated by dry etching such as ICP or the like. Accordingly, the concave portions 511*a* are formed.

Next, as illustrated in FIG. 9C, areas corresponding to the concave portions 511*a* are eliminated by etching on another surface of each of the Si substrate 110, to penetrate each of the Si substrates 110, so that the opening parts 511 are formed.

Next, as illustrated in FIG. 9D, the transparent glass substrate 120 is anodically bonded to another surface of the Si substrate 110 where each of the opening parts 511 are formed. By this process, two members, each including the Si substrate 110 where the glass substrate 120 is bonded, are formed. Respectively, one member is referred to as a first member 501, and another member is referred as a second member 502.

Figure 9E:
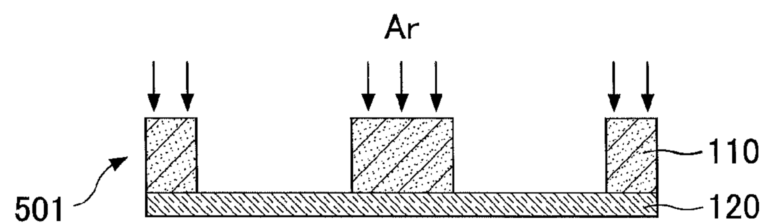

Next, as illustrated in FIG. 9E, the Ar ion beam is irradiated onto one surface where the glass substrate 120 is not bonded in each of two Si substrates 110, and the natural oxide film and the deposits, which are adhered on the one surface of each of two Si substrates 110, are eliminated. Thus, the activation treatment is performed for the one surface of each of two Si substrates 110. As described above, the plasma activation treatment and bonding is conducted for the one surface of each of two Si substrates 110.

Figure 9F:
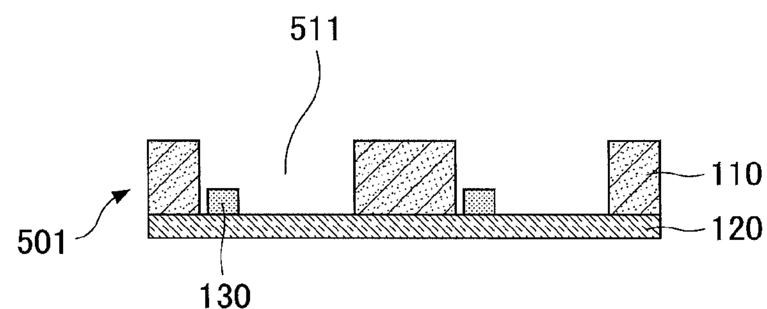

Next, as illustrated in FIG. 9F, the alkali metal raw material 130 such as Cs, Rb, or the like is input into the opening parts 511 of the Si substrate 110 on the first member 501.

Figure 9G:
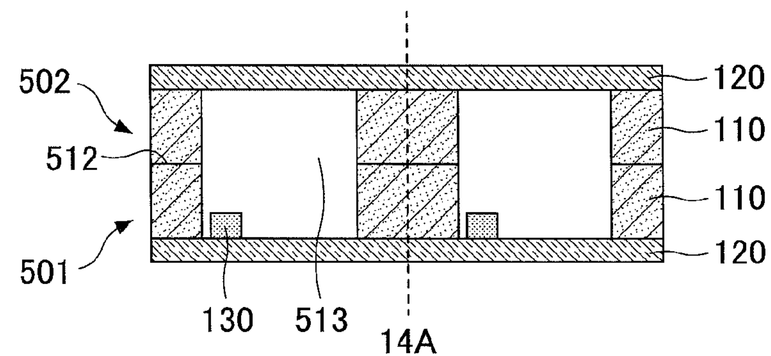

Next, as illustrated in FIG. 9G, Nitrogen used as the buffer gas is introduced into the vacuum chamber to produce the nitrogen atmosphere. In the nitrogen atmosphere, the first member 501 and the second member 502 are bonded to each other in bonding areas 512. Thereby, cell internal portions 513 are formed by the opening parts 511 of the first member 501 and the second member 502.

Figure 9H:
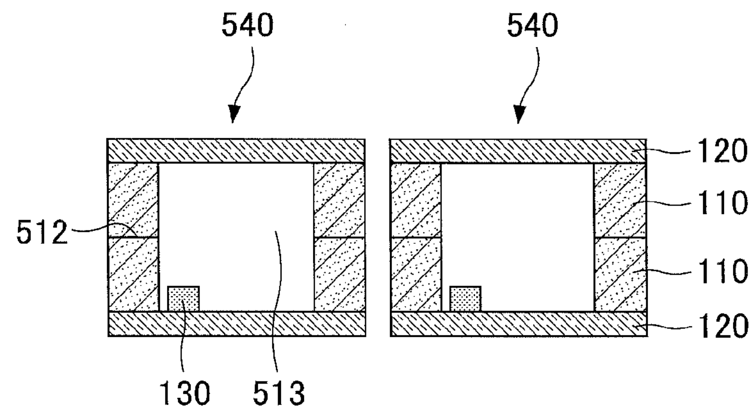

Next, as illustrated in FIG. 9H, a member, in which the first member 501 and the second member 502 are bonded to each other, is divided along a dashed line 14A illustrated in FIG. 9G, so as to separately form each of the Alkaline metal cells 540.

In the fifth embodiment, since the opening parts 511 are etched from both sides thereof, it is possible to reduce an etching workload per time.

Figure 10A:
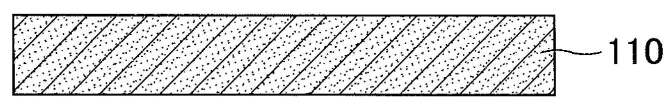
FIG. 10A through FIG. 10C are diagrams illustrating a process chart of another method for fabricating the atomic oscillator in the fifth embodiment.

Moreover, in the fifth embodiment, the opening parts 511 may be formed by a different method. Specifically, as illustrated in FIG. 10A, the Si substrate 110 is prepared.

Figure 10B:
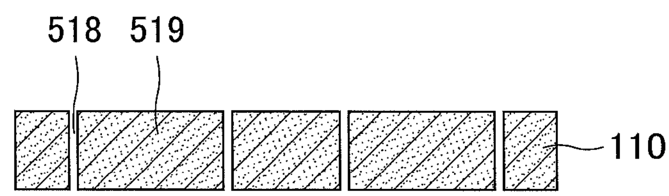

Next, as illustrated in FIG. 10B, on the Si substrate 110, along an edge of an area where each of the opening parts 511 is formed, grooves 518 penetrating from one surface to another surface are formed by etching.

Figure 10C:
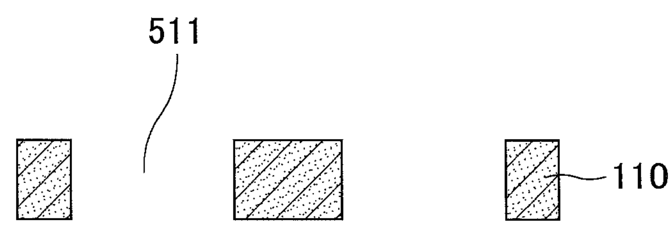

Next, as illustrated in FIG. 10C, by eliminating Si portions 519 surrounded by the grooves 518, it is possible to fabricate the same member as that illustrated in FIG. 9A. Thus, it is possible to form the opening parts 511 on the Si substrate 110.

Subsequent steps are the same as those in FIG. 9D through FIG. 9H.

Also, the fifth embodiment may be applied to the second through fourth embodiments.

Sixth Embodiment

Next, a sixth embodiment will be described. In the sixth embodiment, an atomic oscillator including an Alkaline metal cell different from those in the first through fifth embodiments and a method for fabricating the same will be described with reference to FIG. 11A through FIG. 11H. In FIG. 11A through FIG. 11H, elements that are the same as those illustrated in the previously described figures are indicated by the same reference numerals and the explanation thereof will be omitted.

Figure 11A:
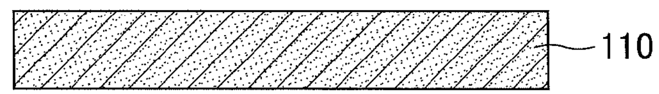
FIG. 11A through FIG. 11H are diagrams illustrating a process chart of a method for fabricating a atomic oscillator in a sixth embodiment.

First, as illustrated in FIG. 11A, the Si substrates 110 are prepared. Each of the two Si substrates 110 are 1 mm in thickness, and both sides thereof are mirror-finished. In the sixth embodiment, as described later, since two Si substrates are bonded to form the Alkaline metal cell, two Si substrates 110 are prepared.

Figure 11B:
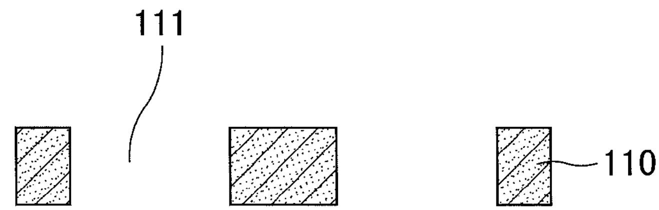

Next, as illustrated in FIG. 11B, the opening parts 111 are formed on one Si substrate 110. Specifically, the photo-resist is coated on the one side of the one Si substrate 110, and is exposed and developed by the aligner. Thus, the resist pattern (not depicted), which includes the openings where the opening parts 111 are formed, is formed. After that, the opening parts 111 are formed to penetrate the Si substrate 110, by conducting the dry etching by the ICP or the like and eliminating Si in an area where the resist pattern is not formed. The dry etching of Si is conducted by the Bosch process which performs the etching by alternately supplying $SF_6$ and $C_4F_8$.

Figure 11C:
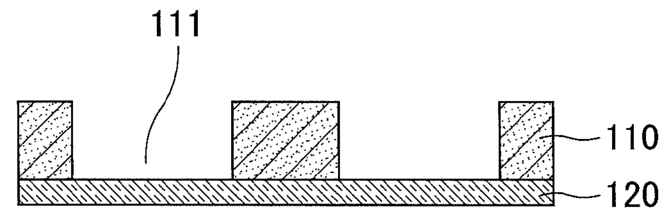

Next, as illustrated in FIG. 11C, the transparent glass substrate 120 is anodically bonded to another surface of the Si substrate 110 where the opening parts 111 are formed. Specifically, in the vacuum chamber, the glass substrate 120 is contacted to the another surface of the Si substrate 110 on which the opening parts 111 are formed, and is anodically bonded by applying −800 V to the glass substrate 120 at 380° C.

Figure 11D:
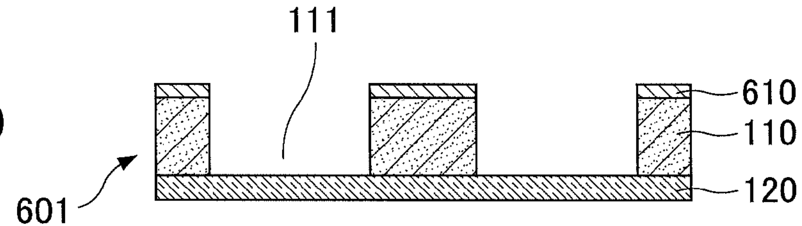

Next, as illustrated in FIG. 11D, by coating and drying low-melting point glass paste on one surface of the Si substrate 110 where the opening parts 111 are formed, a glass frit 610 is formed on areas other than areas where the opening parts 111 are formed, that is, bonding areas. The low-melting point glass paste to be the glass frit 610 includes low-melting point glass micro-particles as a main component, in which an inorganic filler is included to adjust a coefficient of thermal expansion, and which can be reflowed at low temperature. A member formed as described above may be referred as a first member 601 formed by the Si substrate 110 where the glass substrate 120 is bonded. In the sixth embodiment, two Si substrates are bonded. In addition, the second member 102 is formed in the same manner as the method for forming that in the first embodiment.

Figure 11E:
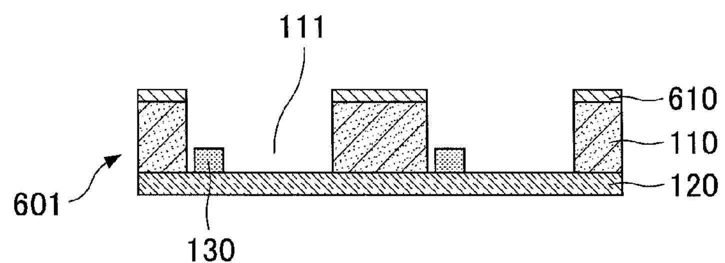

Next, as illustrated in FIG. 11E, in the first member 601, the alkali metal raw material 130 such as Cs, Rb, or the like is input into the opening parts 111 of the Si substrate 110.

Figure 11F:
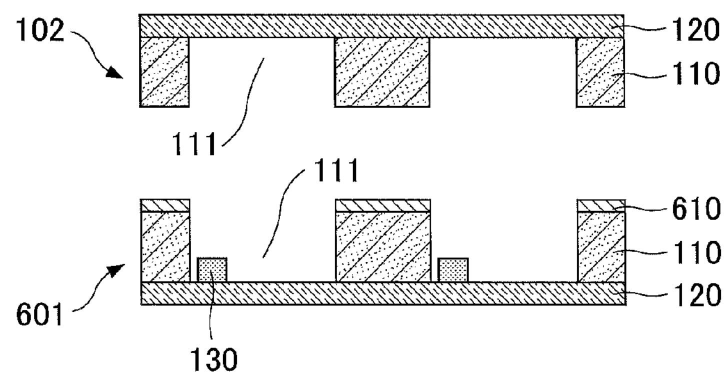

Next, as illustrated in FIG. 11F, the positioning is conducted to face a surface where the glass frit 610 of the first member 601 to a surface where the second member 102 of the Si substrate 110 is exposed. For the second member 102, just before the positioning, on one surface of the Si substrate 110 where the glass substrate 120 is not bonded, the deposits and the oxide film are eliminated by performing a light etching using hydrofluoric acid.

Figure 11G:
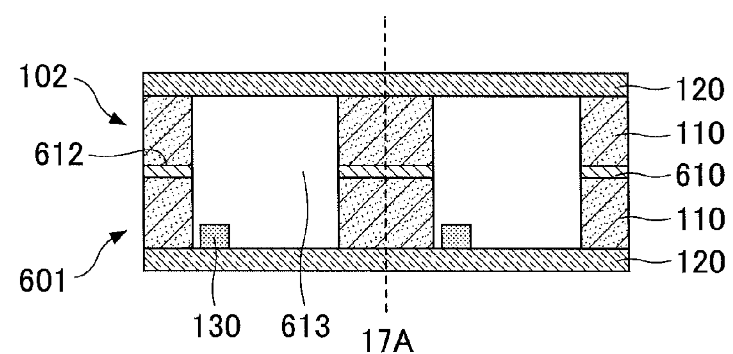

Next, as illustrated in FIG. 11G, Nitrogen used as the buffer gas is introduced into the vacuum chamber to produce the nitrogen atmosphere. In the nitrogen atmosphere, the first member 601 and the second member 102 are bonded to each other through the glass frit 610. Specifically, in the vacuum chamber in the nitrogen atmosphere, the glass frit 610 formed on one surface of the Si substrate 110 of the first member 601 is contacted to one surface of the Si substrate 110 of the second member 102. Then, the glass frit 610 is bonded to the one surface of the Si substrate 110 of the second member 102 by conducting the heat treatment for 20 minutes with 300 kPa at 470 C. As described above, by bonding the first member 601 and the second member 102 in bonding areas 612, two opening parts 111 are formed. Each of the two opening parts 111 is formed by two opening parts 111. In the bonding by the glass frit 610 as described above, gas such as oxygen or the like is not generated. Accordingly, in a case of bonding the first member 601 and the second member 102, there is no case in which the impurities such as oxygen or the like enters cell internal portions 613 where the alkali metal raw material 130 is sealed.

Figure 11H:
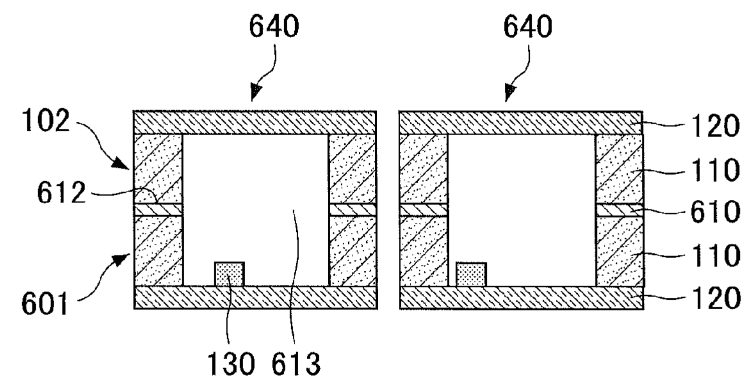

Next, as illustrated in FIG. 11H, the member, where the first member 601 and the second member 102 are bonded to each other, are divided along a dashed line 17A illustrated in FIG. 11G, so as to separately form each of the Alkaline metal cells 640.

By processes described above, it is possible to fabricate the Alkaline metal cells 640 used for the atomic oscillator in the sixth embodiment. In the Alkaline metal cells 640 fabricated as described above, there are fewer amounts of the impurities such as the oxygen or the like included in the cell internal portions 613. It is possible to acquire the highly stable atomic oscillator. It is possible to acquire the atomic oscillator in the sixth embodiment by replacing the Alkaline metal cells 40 of the atomic oscillator in the first embodiment with the Alkaline metal cells 640.

Descriptions other than the above are the same as those in the first embodiment.

Seventh Embodiment

Next, a seventh embodiment will be described. In the seventh embodiment, an atomic oscillator including an Alkaline metal cell different from those in the first through sixth embodiments and a method for fabricating the same will be described with reference to FIG. 12A through FIG. 12E. In FIG. 12A through FIG. 12E, elements that are the same as those illustrated in the previously described figures are indicated by the same reference numerals and the explanation thereof will be omitted.

Figure 12A:
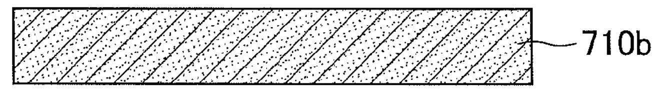
FIG. 12A through FIG. 12E are diagrams illustrating a process chart of a method for fabricating a atomic oscillator in a seventh embodiment.
Figure 12A:
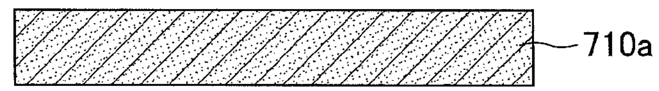

First, as illustrated in FIG. 12A, Si substrates 710*a* and 710*b* to be bases are prepared. The substrates 710*a* and 710*b* are similar to each other, are 1 mm in thickness, and both sides thereof are mirror-finished.

Figure 12B:
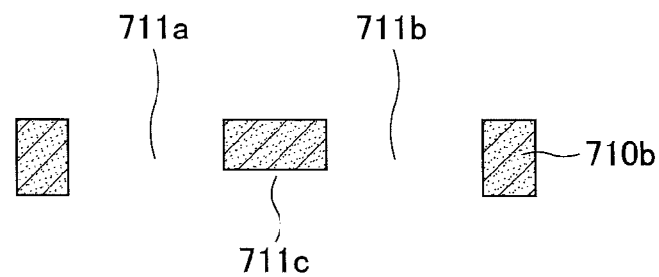
Figure 12B:
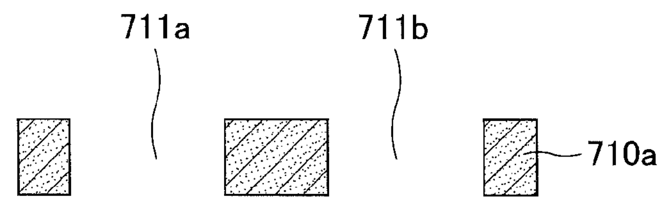

Next, as illustrated in FIG. 12B, opening parts 711*a* and 711*b* are formed to form a gas cell chamber and a raw material chamber in the Si substrate 710*a*. Also, opening parts 711*a*, 711*b*, and 711*c* are formed to form the gas cell chamber, the raw material chamber, and the cell connection part to the Si substrate 710*b*. By these formations, as illustrated in FIG. 13A, for the Si substrate 710*a*, the opening parts 711*a* and 711*b* are separately formed to form the gas cell chamber and the raw material chamber. As illustrated in FIG. 13B, for the Si substrate 710*b*, the opening parts 711*a* and 711*b* for forming the gas cell chamber and the raw material chamber are formed to be connected by the opening part 711*c* to be the cell connection part. As illustrated in FIG. 13C, the cell connection part between the opening parts 711*c* is formed by a thin groove formed by two steps of etching to be lower than the gas cell chamber and the raw material chamber. In this formation, a Cs atomic gas can pass but a chemical compound of Cs can not pass the cell connection part. FIG. 12A through FIG. 12E illustrate a portion corresponding to a cross-sectional surface of the Si substrate 710*a* cut along a dashed line 20A-20B in FIG. 13A, and a portion corresponding to a cross-sectional surface of the Si substrate 710*b* cut along a dashed line 20C-20D in FIG. 13B. Also, FIG. 13C through FIG. 13E illustrate a portion corresponding to a cross-sectional surface of the Si substrate 710*a* cut along a dashed line 20E through 20F in FIG. 13A, and a portion corresponding to a cross-sectional surface of the Si substrate 710*b* cut along a dashed line 20G-20H. Moreover, in the seventh embodiment, the opening part 711*c* for forming the cell connection part is formed by one thin groove. Alternatively, multiple thin grooves may be formed.

Figure 12C:
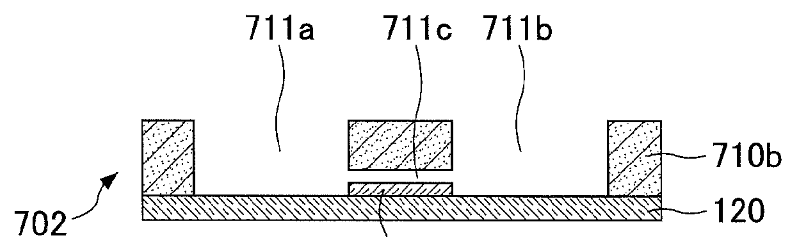
Figure 12C:
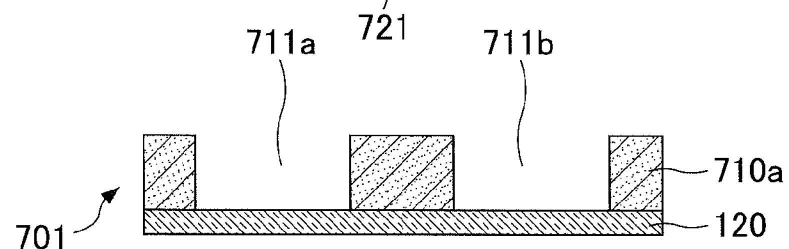
Figure 13A:
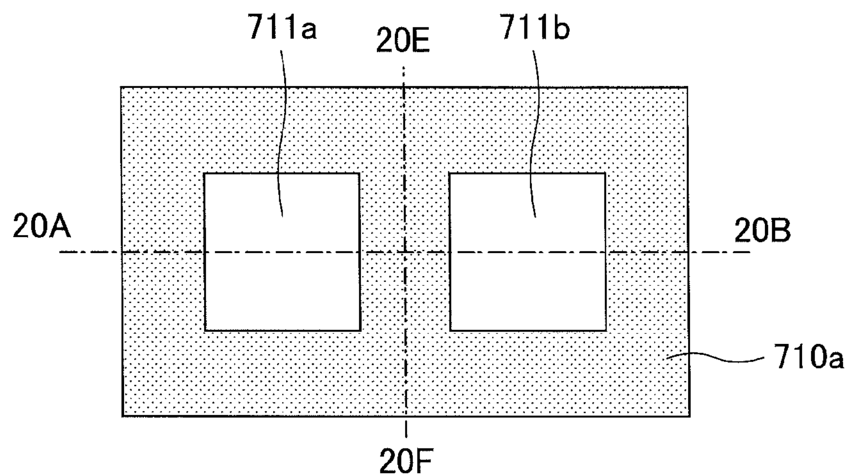
FIG. 13A through FIG. 13E are diagrams for explaining a method for fabricating an atomic oscillator in a seventh embodiment.
Figure 13B:
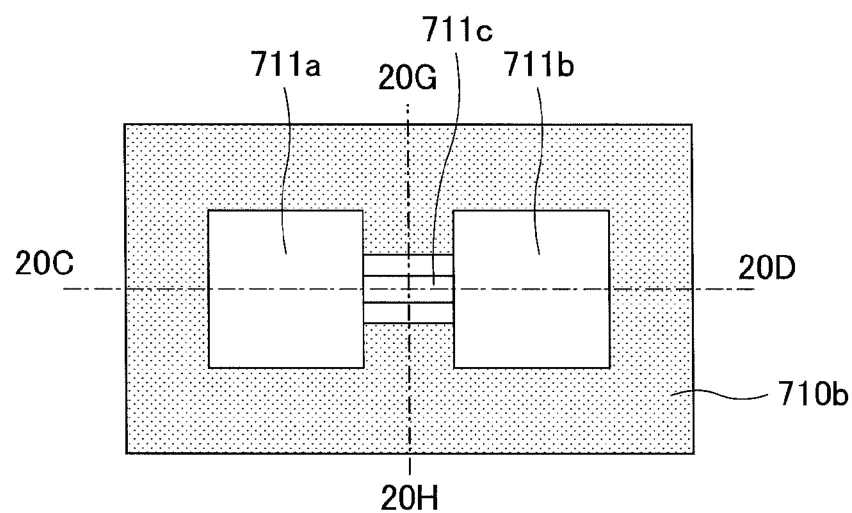
Figure 13C:
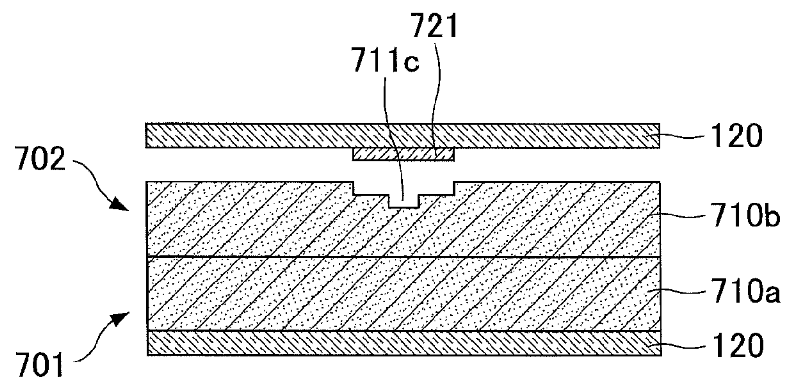
Figure 13D:
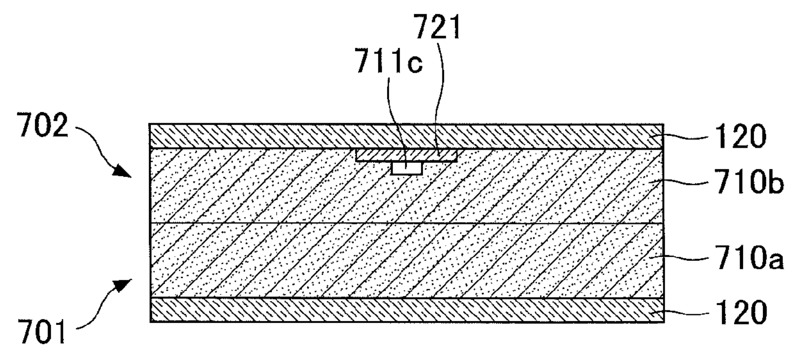
Figure 13E:
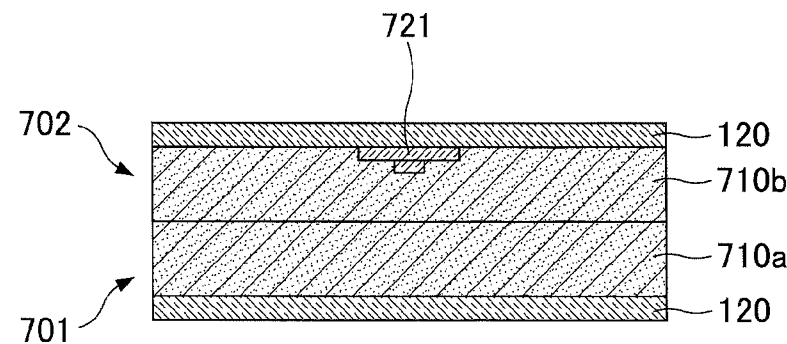

Next, as illustrated in FIG. 12C, a first member 701 is fabricated by anodically bonding the glass substrate to the Si substrate 710*a*. Also, a second member 702 is formed by anodically bonding the glass substrate 120 to the Si substrate.

Figure 12D:
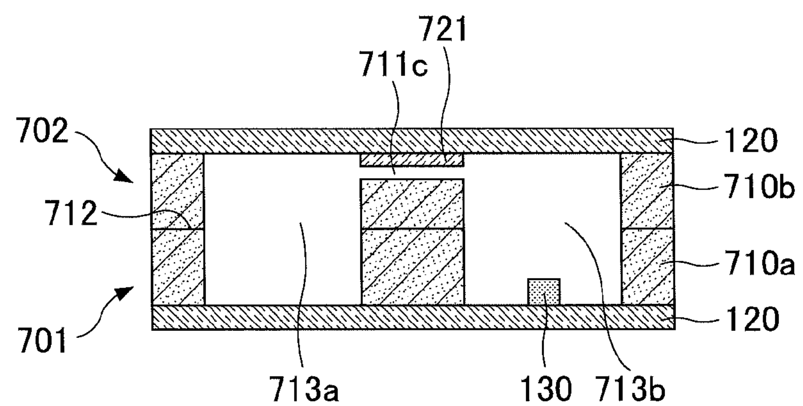

Next, as illustrated in FIG. 12D and FIG. 13D, after the alkali metal raw material 130 such as Cs, Rb, or the like is input into the opening part 711*b* in the first member 701, surfaces of the first member 701 and the second member 702 where Si is exposed are glued to each other. Deposits (not depicted) are attached to surfaces of the Si substrates 710*a* and 710*b* where the glass substrates 120 are not bonded. The deposits are eliminated by irradiating the Ar ion beam. By this process, the plasma activation process is performed to the bonding surface of the first member 701 and the second member 702. Specifically, the positioning is conducted so as to face an activated surface of the first member 701 to an activated surface of the second member 702.

After that, Nitrogen to act as a buffer gas is introduced into the vacuum chamber to produce the nitrogen atmosphere. In the nitrogen atmosphere, an integrated member is formed by bonding the first member 701 and the second member 702 to each other. The plasma activation process is performed for both the surfaces where the first member 701 and the second member 702 are bonded to each other. By contacting and pressing, the first member 701 and the second member 702 are bonded by the Si—Si direct bonding. As described above, by bonding the first member 701 and the second member 702 in the bonding area 712, a first cell internal portion 713*a* and a second cell internal portion 713*b* are formed. Thus, the first cell internal portion 713*a* becomes a gas cell chamber formed by two opening parts 711*a*, and the second cell internal portion 713*b* becomes the raw material chamber formed by two opening parts 711*b*. The first cell internal portion 713*a* and the second cell internal portion 713*b* are connected by the opening part 711*c* to be the cell connection part. The alkali metal raw material 130 is arranged in the second cell internal portion 713*b*.

In the Alkaline metal cell 740 in the seventh embodiment, the alkali metal is generated by heat or the like, and the generated alkali metal passes through the opening part 711*c* to be the cell connection part. The Alkaline metal cell 740 is used in a state where the alkali metal enters the first cell internal portion 713*a*. Accordingly, in the atomic oscillator in the seventh embodiment, light is illuminated to the first cell internal portion 713*a* of the Alkaline metal cell 740.

The alkali metal raw material 130 used in the seventh embodiment may be a chemical compound which is stable in the atmosphere including Cs in a case in which the alkali metal is Cs. Specifically, in a case of using the liquid solution mixing the $BaN_6$ aqueous solution with CsCl as the alkali metal raw material 130, after being enclosed in the second cell internal portion 713*b*, the liquid solution is reacted by 200° C. to generate Cs. Also, in a case of using $CsN_3$ as the alkali metal raw material 130, the $CsN_3$ film is formed in the second cell internal portion 713*b* by the general evaporation method. After the $CsN_3$ is enclosed in the second cell internal portion 713*b*, the UV light is irradiated to generate Cs and $N_2$ to be the buffer gas. Also, as the alkali metal raw material 130, in a case of using the Cs dispenser which is stable in the atmosphere, after the Cs dispenser is input into the second cell internal portion 713*b* and is sealed, the laser beam is irradiated to the Cs dispenser alone to heat. Then, Cs is generated.

Figure 12E:
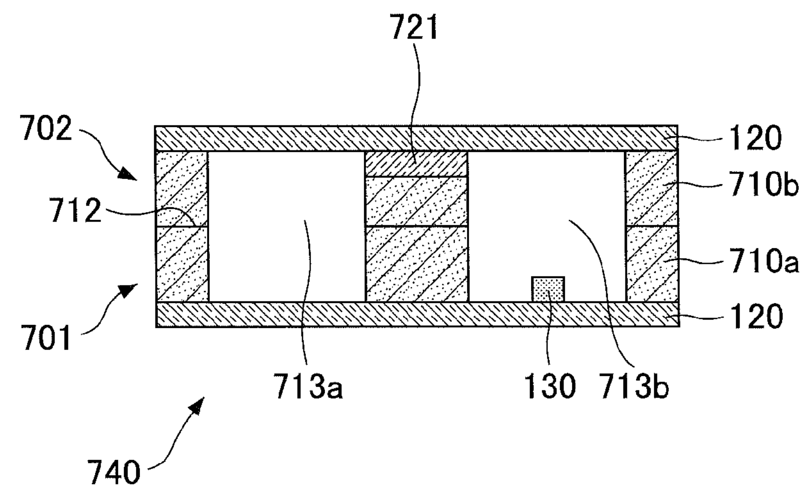

Next, as illustrated in FIG. 12E and FIG. 13E, in an oven of the nitrogen atmosphere, a glass frit 721 is melted by performing a pressure treatment for 20 minutes with 300 kPa at 470° C., thereby the cell connection part is sealed.

By the above described process, it is possible to fabricate the Alkaline metal cell 740 used for the atomic oscillator in the seventh embodiment. In the Alkaline metal cell 740 fabricated as described above, there are fewer amounts of impurities such as oxygen or the like included in the cell internal portions 713*a*. Also, since the opening part 721 being the cell connection part is sealed by the glass frit 721, the first cell internal portion 713*a* to be the gas cell chamber and the second cell internal portion 713*b* to be the raw material chamber are separate. The atmosphere in the first cell internal portion 713*a* to be the gas cell chamber is not influenced by a change over time of the Alkaline metal raw material 130 due to absorption or the like. Accordingly, it is possible to further improve the frequency stability of the atomic oscillator.

After the cell connection part is sealed, an Alkaline metal raw material chamber, which becomes unnecessary, is separated to use the gas cell chamber alone as the Alkaline metal cell 740. In this case, a heat capacity of the Alkaline metal cell becomes less, and energy-saving is improved.

Descriptions other than the above are the same as those in the first embodiment.

Eighth Embodiment

Next, an eighth embodiment will be described. The eighth embodiment includes a configuration in which the atomic oscillators in the first through seventh embodiments are integrated.

Figure 14:
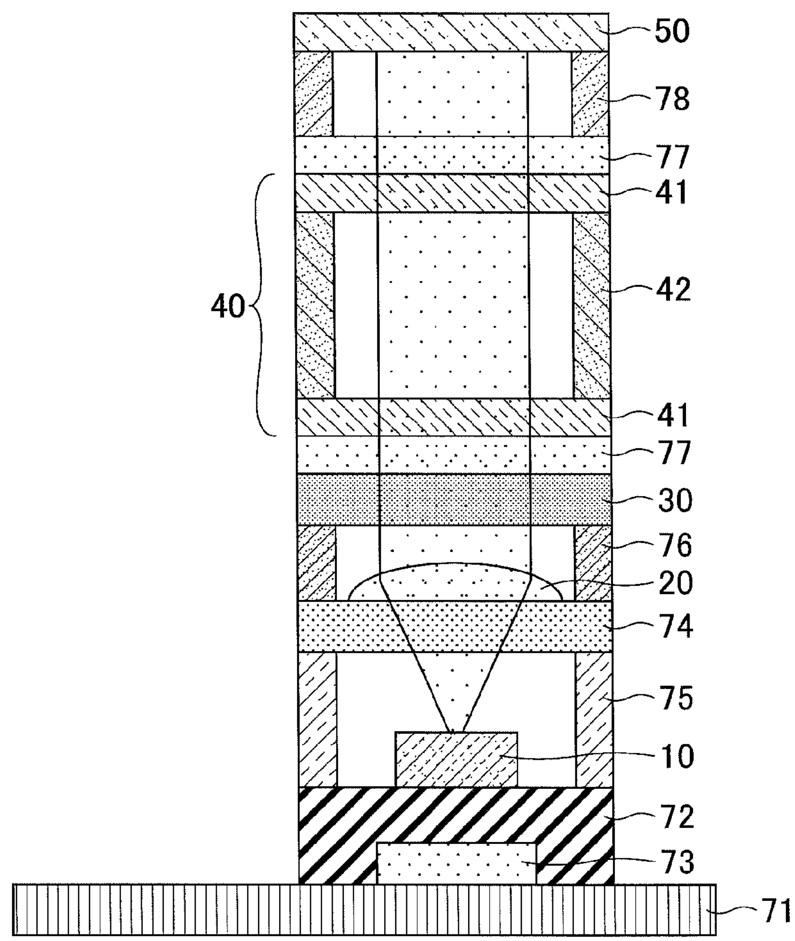
FIG. 14 is a diagram illustrating a configuration of an atomic oscillator in an eighth embodiment.

An atomic oscillator in the eighth embodiment will be described with reference to FIG. 14. The atomic oscillator in the eighth embodiment is formed in a lengthwise direction on a circuit substrate 71. On the circuit substrate 71, an alumina substrate 72 is provided, and a surface emitting laser element to be a light source 10 is provided on the alumina substrate 72. On the alumina substrate 72, a heater 73 for the surface emitting laser is provided to control temperature or the like of the light source 10. Above the light source 10, a ND (Neutral Density) filter 74 is provided. The ND filter 74 is arranged at a predetermined position by a heat-insulating spacer 75 formed by glasses or the like. A collimate lens 20 is provided above the ND filter 74. A λ/4 plate 30 is provided above the collimate lens 20. The λ/4 plate 30 is arranged at a predetermined position by the spacers 76 formed by silicon or the like. The Alkaline metal cell 40 is provided above the λ/4 plate 30. The Alkaline metal cell 40 includes two glass substrates 41. In a state in which the two glass substrates 41 are facing to each other, edges of the two glass substrates 41 are connected by silicon substrates 42. The Alkaline metal is enclosed in a portion surrounded by the glass substrate 41 and the silicon substrate 42. In the Alkaline metal cell 40, a surface which a laser light passes is formed by the glass substrate 41. A heater 77 is provided at both an upper side and a lower side of the Alkaline metal cell 40. It is possible to set the Alkaline metal cell 40 at a predetermined temperature. A light detector 50 is provided above the Alkaline metal cell 40, and is arranged at a predetermined position by spacers 78 formed by silicon.

Figure 15:
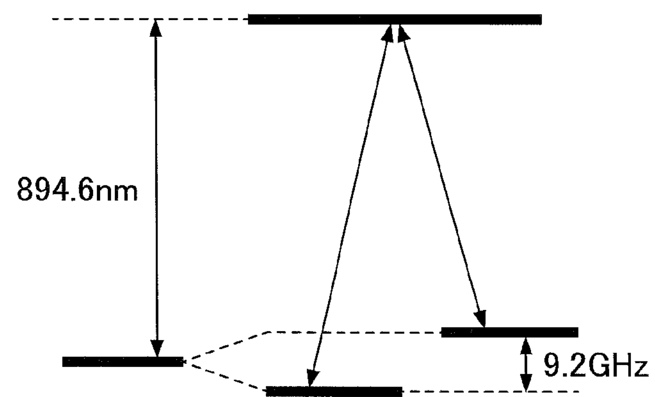
FIG. 15 is a diagram for explaining a configuration of an atomic energy level in a CPT method.
Figure 16:
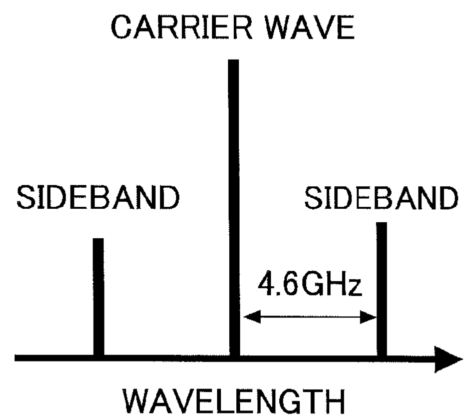
FIG. 16 is a diagram for explaining an output wavelength when a surface emitting laser is modulated.
Figure 17:
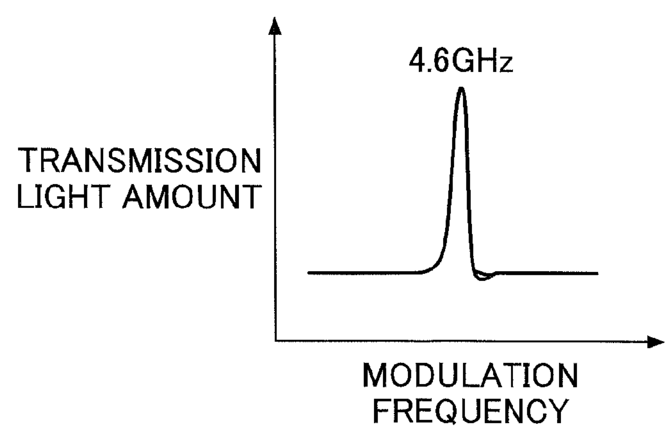
FIG. 17 is a diagram illustrating a correlation between a modulation frequency and a transmission light amount.

Next, FIG. 15 illustrates a configuration of an atomic energy level related to the CPT. When electrons are exited simultaneously from two basal levels to excitation levels, the light absorption rate is deteriorated. This deteriorating of the light absorption rate is utilized. A element, in which a wavelength of a carrier wave is closer to 894.6 nm, is used for the surface emitting laser. The wavelength of the carrier wave may be tuned by changing temperature or an output of the surface emitting laser. As illustrated in FIG. 16, a sideband occurs at both sides of the carrier wave by applying modulation. The carrier wave is modulated at 4.6 GHz so that its frequency difference corresponds to 9.2 GHz which is intrinsic frequency of a Cs atom. As illustrated in FIG. 17, a laser light passing through Cs gas being excited becomes maximum when a sideband frequency difference corresponds to the intrinsic frequency of the Cs atom. By feeding back an output of the light detector 50 by a modulator 60 so as to retain a maximum value, a modulation frequency of the surface emitting laser element at the light source is adjusted. Since the intrinsic oscillation frequency of an atom is significantly stable, the modulation frequency becomes a stable value, and this value is read out as information to be output. In a case in which the wavelength is 894.6 nm, a wavelength in a range of ±1 nm may be required.

In the Alkaline metal cell 40 of the atomic oscillator in the eighth embodiment, the silicon substrate 42 in the eighth embodiment corresponds to the Si substrate 110 in the first embodiment and the like. The glass substrate 41 corresponds to the glass substrate 120 in the first embodiment and the like. Also, in the atomic oscillator in the eighth embodiment, instead of the Alkaline metal cells 40, the Alkaline metal cells 240, 340, 440, 540, 640, or 740 in the second through seventh embodiments may be used similarly.

Moreover, in the eighth embodiment, Cs is used as the Alkaline metal, and the surface emitting laser having a wavelength of 894.6 nm is used to utilize a transition of a D1 line. Alternatively, a wavelength of 852.3 nm may be used in a case of using a D2 line of Cs. Also, Rb (Rubidium) may be used as the Alkaline metal. A wavelength of 795.0 nm may be used to utilize the D1 line, and a wavelength of 780.2 nm may be used to utilize the D2 line. Also, a modulation frequency for using Rb is modulated by 3.4 GHz in a case of $^{87}$Rb, and is modulated by 1.5 GHz in a case of $^{85}$Rb. In these wavelengths, a wavelength in the range of ±1 nm may be required.

According to the present invention, it is possible to provide the highly stable atomic oscillator in which the impurities such as oxygen or the like in the alkaline metal cell are reduced.

Moreover, the present invention is not limited to the configurations in the first through eighth embodiments described above, including combinations with other elements. In this viewpoint, variations and modifications may be made without departing from the scope of the invention, and may be properly defined depending on its application aspect.

The present application is based on Japanese Priority Patent Applications No. 2011-155152 filed on Jul. 13, 2011 and No. 2012-066675 filed on Mar. 23, 2012, the entire contents of which are hereby incorporated by reference.

What is claimed is:

1. An atomic oscillator including an alkali metal cell in which the alkali metal is sealed, a light source which illuminates a laser beam to the alkali metal cell, and a light detector which detects light passing through the alkali metal cell, wherein the alkali metal cell comprises:

a first member in which a first glass substrate is bonded on a second surface of a first substrate where a first opening part is formed to penetrate between a first surface and the second surface;

a second member in which a second glass substrate is bonded to a fourth surface of a second substrate where a second opening part is formed to penetrate between a third surface and the fourth surface;

a cell internal portion which is formed by the first opening part of the first member and the second opening part of the second member by bonding the first surface of the first substrate in the first member to the third surface of the second substrate in the second member, and an alkali metal raw material which is enclosed by the cell internal portion, wherein a metal film is further formed on both of the first surface of the first substrate in the first member and the third surface of the second substrate in the second member; and the first surface of the first substrate in the first member and the third surface of the second substrate in the second member are bonded due to direct bonding of metals.

2. The atomic oscillator as claimed in claim 1, wherein a glass fit is further provided on one of or both of the first surface of the first substrate in the first member and the third surface of the second substrate in the second member; and the first surface of the first substrate in the first member and the third surface of the second substrate in the second member are bonded due to bonding through the glass fit.

3. The atomic oscillator as claimed in claim 1, wherein the first substrate and the second substrate are formed by silicon.

4. An atomic oscillator including an alkali metal cell in which the alkali metal is sealed, a light source which illuminates a laser beam to the alkali metal cell, and a light detector which detects light passing through the alkali metal cell, wherein the alkali metal cell comprises:

a first member in which a first glass substrate is bonded on a second surface of a first substrate where a first opening part is formed to penetrate between a first surface and the second surface;

a second member in which a second glass substrate is bonded to a fourth surface of a second substrate where a second opening part is formed to penetrate between a third surface and the fourth surface;

a cell internal portion which is formed by the first opening part of the first member and the second opening part of the second member by bonding the first surface of the first substrate in the first member to the third surface of the second substrate in the second member, and an alkali metal raw material which is enclosed by the cell internal portion, wherein the atomic oscillator further comprises at least one third substrate which is provided between the first member and the second member, the at least one third substrate including a third opening part having approximately the same shape as shapes of the first opening part and the second opening part, wherein, the first member is bonded to the at least one third substrate and the second member is bonded to the at least one third substrate; and the cell internal portion is formed by the first opening part of the first member, the second opening part of the second member, and the third opening part of the at least one third substrate.

5. The atomic oscillator as claimed in claim 3, wherein a distance between the first glass substrate and the second glass substrate is greater than or equal to 1.5 mm.

6. The atomic oscillator as claimed in claim 1, wherein the cell internal portion includes a first cell internal portion and a second cell internal portion;

the first cell internal portion is connected to the second cell internal portion by a cell connection part;

the alkali metal raw material is a chemical compound of alkali metal, and is arranged in the second cell internal portion; and light illuminated from the light source passes the first cell internal portion.

7. The atomic oscillator as claimed in claim 1, wherein the atomic oscillator controls modulation frequency by a light absorption feature due to a quantum interference effect caused by two types of resonance light, by controlling two lights having different wavelengths to enter the alkali metal cell including sidebands emitted from the light source.

8. A method for fabricating an atomic oscillator which includes an alkali metal cell in which the alkali metal is sealed, a light source which illuminates a laser beam onto the alkali metal cell, and a light detector which detects light passing through the alkali metal cell, said method comprising:

forming a first opening part which penetrates between a first surface and a second surface of a first substrate and an second opening part which penetrates between a third surface and a fourth surface of a second substrate, the first opening part and the second opening part having approximately the same shape;

forming a first member by bonding a first glass substrate to the second surface of the first substrate where the first opening part is formed, and a second member by bonding a second glass substrate to the fourth surface of the second substrate where the second opening part is formed;

inputting an alkali metal raw material into the first opening part of the first member or the second opening part of the second member; and bonding a first surface of the first substrate of the first member to a third surface of the second substrate of the second member, wherein a cell internal portion of the alkali metal cell is formed by the first opening part of the first member and the second opening part of the second member, wherein a metal film is formed onto both of the first surface of the first substrate of the first member and the third surface of the second substrate of the second member; and the first member is bonded to the second member by direct bonding of metals.

9. The method as claimed in claim 8, wherein the first substrate and the second substrate are formed by silicon; and the first member and the second member are bonded by direct bonding of the silicon.

10. A method for fabricating an atomic oscillator which includes an alkali metal cell in which the alkali metal is sealed, a light source which illuminates a laser beam onto the alkali metal cell, and a light detector which detects light passing through the alkali metal cell, said method comprising:

forming a first opening part which penetrates between a first surface and a second surface of a first substrate and an second opening part which penetrates between a third surface and a fourth surface of a second substrate, the first opening part and the second opening part having approximately the same shape;

forming a first member by bonding a first glass substrate to the second surface of the first substrate where the first opening part is formed, and a second member by bonding a second glass substrate to the fourth surface of the second substrate where the second opening part is formed;

inputting an alkali metal raw material into the first opening part of the first member or the second opening part of the second member; and bonding a first surface of the first substrate of the first member to a third surface of the second substrate of the second member, wherein a cell internal portion of the alkali metal cell is formed by the first opening part of the first member and the second opening part of the second member;

forming a third opening part which is approximately the same shape as the first and second opening parts and penetrates between a fifth surface and a sixth surface in at least one third substrate, wherein in the bonding the first member to the second member, the first surface of the first substrate of the first member is bonded to the third surface of the second substrate of the second member through the at least one third substrate.

11. The method as claimed in claim 8, wherein a glass frit is formed on one of or both of the first surface of the first substrate of the first member and the third surface of the second member of the second member, and the first member is bonded to the second member through the glass frit.

12. The method as claimed in claim 8, wherein the alkali metal raw material is a chemical compound of the alkali metal; and after the cell internal portion is formed, the alkali metal is generated by heating the alkali metal raw material, illuminating ultraviolet light, or illuminating the laser beam.

13. A method for fabricating an atomic oscillator which includes an alkali metal cell in which the alkali metal is sealed, a light source which illuminates a laser beam onto the alkali metal cell, and a light detector which detects light passing through the alkali metal cell, said method comprising:

forming a first opening part which penetrates between a first surface and a second surface of a first substrate and an second opening part which penetrates between a third surface and a fourth surface of a second substrate, the first opening part and the second opening part having approximately the same shape;

forming a first member by bonding a first glass substrate to the second surface of the first substrate where the first opening part is formed, and a second member by bonding a second glass substrate to the fourth surface of the second substrate where the second opening part is formed;

inputting an alkali metal raw material into the first opening part of the first member or the second opening part of the second member; and bonding a first surface of the first substrate of the first member to a third surface of the second substrate of the second member, wherein a cell internal portion of the alkali metal cell is formed by the first opening part of the first member and the second opening part of the second member, wherein the cell internal portion includes a first cell internal portion and a second cell internal portion;

the first cell internal portion is connected to the second cell internal portion by a cell connection part;

the alkali metal raw material is a chemical compound of the alkali metal, and is arranged in the second cell internal portion; and the alkali metal is generated by heating the alkali metal raw material, illuminating ultraviolet light, and illuminating the laser beam, so that the alkali metal enters the first cell internal portion.

14. The method as claimed in claim 13, further comprising spatially separating the first cell internal portion and the second cell internal portion by sealing the cell connection part after moving the alkali metal into the first cell internal portion.

15. The method as claimed in claim 14, wherein the cell connection part is sealed by heating the glass frit.

16. A method for fabricating an atomic oscillator which includes an alkali metal cell in which the alkali metal is sealed, a light source which illuminates a laser beam onto the alkali metal cell, and a light detector which detects light passing through the alkali metal cell, said method comprising:

forming a first opening part which penetrates between a first surface and a second surface of a first substrate and an second opening part which penetrates between a third surface and a fourth surface of a second substrate, the first opening part and the second opening part having approximately the same shape;

forming a first member by bonding a first glass substrate to the second surface of the first substrate where the first opening part is formed, and a second member by bonding a second glass substrate to the fourth surface of the second substrate where the second opening part is formed;

inputting an alkali metal raw material into the first opening part of the first member or the second opening part of the second member; and bonding a first surface of the first substrate of the first member to a third surface of the second substrate of the second member, wherein a cell internal portion of the alkali metal cell is formed by the first opening part of the first member and the second opening part of the second member, wherein the first substrate and the second substrate are formed by silicon, and the first member and the second member are bonded by direct bonding of the silicon, and wherein the inputting the alkali metal raw material and the bonding the first member to the second member are conducted in a vacuum chamber; and the method further includes conducting an activation process with respect to bonding surfaces by illuminating plasma onto the bonding surfaces for bonding the first member to the second member in the vacuum chamber, before the bonding the first member to the second member.

17. The method as claimed in claim 8, wherein the bonding the first member to the second member is performed in an atmosphere of Nitrogen or an inert gas in the vacuum chamber.

* * * * *